United States Patent
Jeon et al.

(10) Patent No.: US 9,607,853 B2
(45) Date of Patent: Mar. 28, 2017

(54) PATTERNING METHOD USING METAL MASK AND METHOD OF FABRICATING SEMICONDUCTOR DEVICE INCLUDING THE SAME PATTERNING METHOD

(71) Applicant: SAMSUNG ELECTRONICS CO., LTD., Suwon-si, Gyeonggi-do (KR)

(72) Inventors: Kyung-yub Jeon, Yongin-si (KR); Dong-chan Kim, Seoul (KR); Gyung-jin Min, Seongnam-si (KR); Jae-hong Park, Seongnam-si (KR); Je-woo Han, Hwaseong-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 14/656,235

(22) Filed: Mar. 12, 2015

(65) Prior Publication Data
US 2016/0013070 A1    Jan. 14, 2016

(30) Foreign Application Priority Data

Jul. 8, 2014    (KR) ........................ 10-2014-0085355

(51) Int. Cl.
| | |
|---|---|
| *H01L 21/302* | (2006.01) |
| *H01L 21/311* | (2006.01) |
| *H01L 21/033* | (2006.01) |
| *H01L 21/3213* | (2006.01) |
| *H01L 21/02* | (2006.01) |
| *H01L 21/768* | (2006.01) |

(52) U.S. Cl.
CPC .. *H01L 21/31144* (2013.01); *H01L 21/02107* (2013.01); *H01L 21/0332* (2013.01); *H01L 21/0337* (2013.01); *H01L 21/31116* (2013.01); *H01L 21/32136* (2013.01); *H01L 21/32139* (2013.01); *H01L 21/76816* (2013.01); *H01L 21/76898* (2013.01)

(58) Field of Classification Search
CPC ......... H01L 21/31144; H01L 21/02107; H01L 21/0332; H01L 21/0337; H01L 21/31116
See application file for complete search history.

(56) References Cited

U.S. PATENT DOCUMENTS

| | | | |
|---|---|---|---|
| 6,774,033 B1 * | 8/2004 | Ben-Tzur | .......... H01L 21/32051 257/E21.295 |
| 7,968,506 B2 | 6/2011 | Chou et al. | |
| 8,071,475 B2 | 12/2011 | Tanaka et al. | |
| 8,361,906 B2 | 1/2013 | Lee et al. | |

(Continued)

FOREIGN PATENT DOCUMENTS

| | | |
|---|---|---|
| JP | 2011-510179 | 3/2011 |
| JP | 2013-254532 | 12/2013 |

(Continued)

*Primary Examiner* — Bradley K Smith
(74) *Attorney, Agent, or Firm* — Lee & Morse, P.C.

(57) ABSTRACT

A patterning method using a metal mask includes sequentially forming a lower metal layer and an upper metal layer on an etching object layer, forming an upper metal mask, forming the upper metal mask including patterning the upper metal layer, forming a lower metal mask, forming the lower metal mask including patterning the lower metal layer using the upper metal mask, and patterning the etching object layer using the upper metal mask.

11 Claims, 22 Drawing Sheets

(56) References Cited

U.S. PATENT DOCUMENTS

| | | | |
|---|---|---|---|
| 9,040,422 B2* | 5/2015 | Wang ................ | H01L 21/32136 |
| | | | 438/676 |
| 9,240,347 B2* | 1/2016 | Chandrashekar . | H01L 21/76877 |
| 2007/0111467 A1 | 5/2007 | Kim | |
| 2011/0033726 A1 | 2/2011 | Jorda Sanuy et al. | |
| 2011/0281379 A1* | 11/2011 | Yang ................ | H01L 21/02071 |
| | | | 438/16 |
| 2013/0178057 A1* | 7/2013 | Huisinga ........... | H01L 21/31144 |
| | | | 438/633 |
| 2013/0313695 A1 | 11/2013 | Noichi et al. | |

FOREIGN PATENT DOCUMENTS

| | | |
|---|---|---|
| KR | 10-0801308 | 2/2008 |
| KR | 10-2008-0086686 | 9/2008 |
| KR | 10-2010-0084506 | 7/2010 |

* cited by examiner

PATTERNING METHOD USING METAL MASK AND METHOD OF FABRICATING SEMICONDUCTOR DEVICE INCLUDING THE SAME PATTERNING METHOD

CROSS-REFERENCE TO RELATED APPLICATION

Korean Patent Application No. 10-2014-0085355, filed on Jul. 8, 2014, in the Korean Intellectual Property Office, and entitled: "Patterning Method Using Metal Mask and Method of Fabricating Semiconductor Device Including the Same Patterning Method," is incorporated by reference herein in its entirety.

BACKGROUND

1. Field

Embodiments relate to a patterning method using a metal mask and a method of fabricating a semiconductor device including the patterning method.

2. Description of the Related Art

Recently, with the development of the semiconductor industries and demands from users, electronic apparatuses have become more miniaturized and more efficient. Thus, semiconductor devices which are essential components of electronic apparatuses have also been asked to be miniaturized and to have a high performance.

SUMMARY

Embodiments are directed to a patterning method using a metal mask, the method including sequentially forming a lower metal layer and an upper metal layer on an etching object layer, forming an upper metal mask, forming the upper metal mask including patterning the upper metal layer, forming a lower metal mask, forming the lower metal mask including patterning the lower metal layer using the upper metal mask, and patterning the etching object layer using the upper metal mask.

With respect to a first etchant, the upper metal layer may have a higher etch rate than the lower metal layer, and, with respect to a second etchant, the lower metal layer may have a higher etch rate than the upper metal layer.

The etching object layer may be formed of at least one selected from an oxide material, a nitride material, an oxynitride material, and silicon, the lower metal layer may include tungsten (W), the upper metal layer may includes titanium (Ti), the first etchant may include chlorine (Cl), and the second etchant may include fluorine (F).

An etching selectivity of the etching object layer with respect to the lower metal layer may be higher than an etching selectivity of the etching object layer with respect to a non-metallic material layer.

The forming of the lower metal mask may include a first step of etching the lower metal layer using the upper metal mask, a second step of forming a passivation layer on the upper metal mask and the lower metal layer, and a third step of etching the lower metal layer using the upper metal mask and the passivation layer.

The second step and the third step may be repeated until the etching object layer is exposed, and the second step may be performed before a side wall of the lower metal layer is exposed in the third step.

An etch stop layer may be formed on the etching object layer, and the etch stop layer may be formed of a material having an etching selectivity with respect to the lower metal layer.

The sequentially forming of the lower metal layer and the upper metal layer may include forming a buffer layer on the lower metal layer and forming the upper metal layer on the buffer layer.

Embodiments are also directed to a patterning method using a metal mask, the method including disposing an etch structure, in which a lower metal layer and an upper metal layer are sequentially stacked, on an etching object layer in a capacitively coupled plasma (CCP) chamber, forming an upper metal mask, forming the upper metal mask including patterning the upper metal layer in the CCP chamber, forming a lower metal mask, forming a lower metal mask including patterning the lower metal layer using the upper metal mask in the CCP chamber, and patterning the etching object layer using the upper metal mask in the CCP chamber.

The CCP chamber may include a source power and a bias power which are electrically connected to an electrostatic chuck, and at least one magnet disposed outside the CCP chamber, and the source power may be a high frequency power having a frequency that is equal to or higher than 100 MHz.

The upper metal layer may include titanium (Ti), the lower metal layer may include tungsten (W), the forming of the upper metal mask may include etching the upper metal layer using a first etchant including chlorine (Cl), and the forming of the lower metal mask may include etching the lower metal layer using a second etchant including fluorine (F).

The forming of the lower metal mask may include etching an upper portion of the lower metal layer using the upper metal mask, and repeatedly forming a passivation layer and etching the lower metal layer.

The etch structure may include a hard mask formed on the upper metal layer, and the forming of the upper metal mask may include patterning the upper metal mask using the hard mask.

An etch stop layer formed of a material having an etching selectivity with respect to the lower metal layer may be disposed on the etching object layer, and the patterning of the lower metal layer may include exposing the etch stop layer and exposing the etching object layer by etching the etch stop layer before the patterning of the etching object layer.

A method of fabricating a semiconductor device may include forming a through-hole in an etching object layer using a method according to an embodiment, and filling the through-hole with at least one selected from a semiconductor, a conductor, and a dielectric material.

Embodiments are also directed to a method of fabricating a semiconductor device, the method including providing a substrate having a target layer, forming a first layer that contains a first metal on the target layer, forming a mask layer that contains a second metal on the first layer such that the first layer is between the target layer and the mask layer, the second layer having a composition that is different from that of the first layer, the mask layer having an opening that exposes a portion of the first layer, etching the exposed portion of the first layer through the opening in the mask layer using a first etchant to form an opening in the first layer, wherein the first etchant has either an active fluorine species or an active chlorine species, and etching the target layer through the opening in the first layer. When the first etchant has the active fluorine species, the first metal may be tungsten and the second metal may be titanium. When the first etchant has the active chlorine species, the first metal may be titanium and the second metal may be tungsten.

The first etchant may have the active fluorine species, the first metal may be tungsten, and the second metal may be titanium.

The composition of the first layer may be selected to have an etch rate with respect to the first etchant that is seven times greater than the rate at which the mask layer is etched by the first etchant.

The first etchant may have the active chlorine species, the first metal may be titanium, and the second metal may be tungsten.

The mask layer may have a thickness that is less than that of the first layer.

BRIEF DESCRIPTION OF THE DRAWINGS

Features will become apparent to those of skill in the art by describing in detail example embodiments with reference to the attached drawings in which.

DETAILED DESCRIPTION

Figure 1:
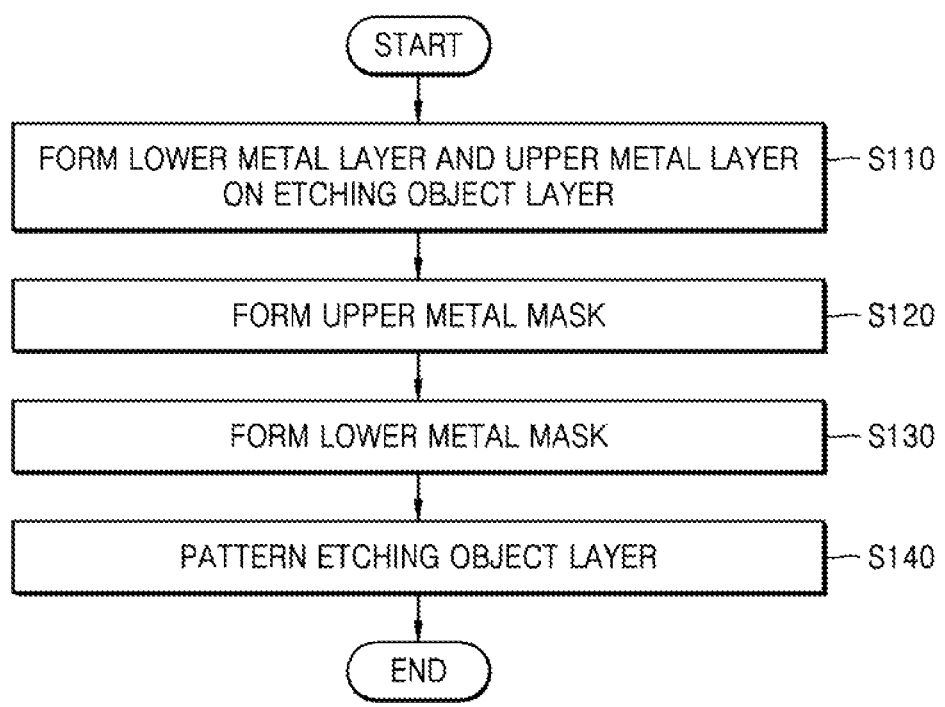
FIG. 1 illustrates a flowchart of a patterning method using a metal mask, according to an example embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey example implementations to those skilled in the art.

As used herein, the term "and/or" includes any and all combinations of one or more of the associated listed items. Expressions such as "at least one of," when preceding a list of elements, modify the entire list of elements and do not modify the individual elements of the list.

Hereinafter, it will be understood that when a component is referred to as being "connected to" another component, it can be directly connected to the other component, or intervening components may also be present therebetween. Similarly, it will also be understood that when a component is referred to as being "on" another component, it can be directly on the other component, or intervening components may also be present therebetween. In the drawings, the thicknesses of layers and regions and the sizes of components may be exaggerated for clarity. Like reference numerals refer to like elements throughout. The terminology used herein is for the purpose of describing particular embodiments only and is not intended to be limiting of example embodiments.

FIG. 1 illustrates a flowchart of a patterning method using a metal mask, according to an example embodiment. FIGS. 2A through 2E illustrate cross-sectional views for describing the patterning method using a metal mask of FIG. 1. For convenience of explanation, FIG. 1 will be referred to together with FIGS. 2A through 2E.

Figure 2A:
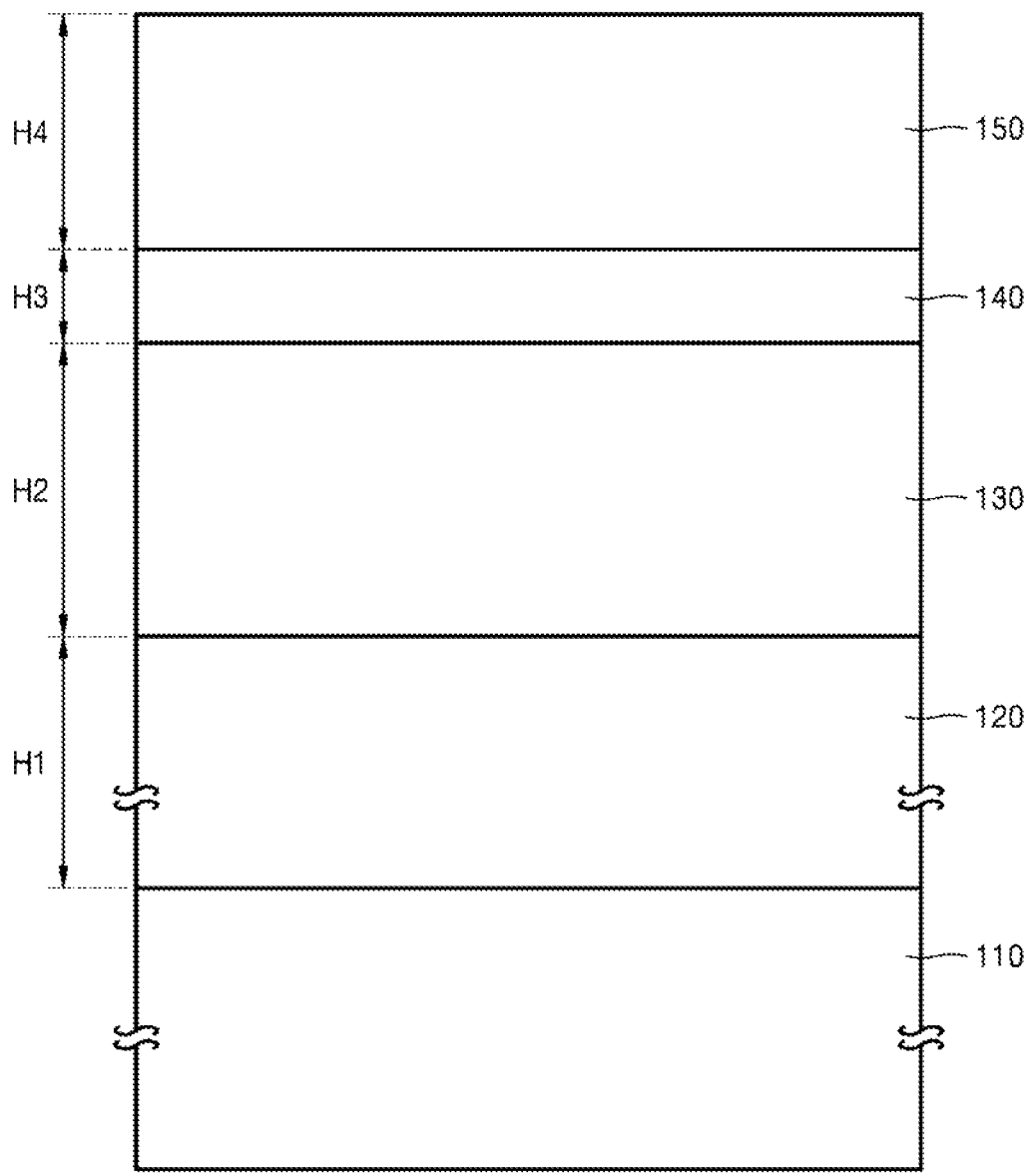
FIGS. 2A through 2E illustrate cross-sectional views for describing a patterning method using a metal mask, according to an example embodiment.

Referring to FIGS. 1 and 2A, according to the patterning method using a metal mask in the present example embodiment, firstly, a lower metal layer 130 and an upper metal layer 140 are sequentially formed on an etching object layer 120 in operation S110.

The etching object layer 120 may vary according to a type of a semiconductor device which is to be fabricated and a structure which is to be formed in the semiconductor device. For example, the etching object layer 120 may be a material layer in which holes having high aspect ratios are formed. The etching object layer 120 may be a material layer, such as a semiconductor layer such as silicon, a conductive layer such as a metal, or an insulating layer such as a nitride layer or an oxide layer. The etching object layer 120 may be generally a material layer which is formed by being deposited on a substrate 110. However, the etching object layer 120 may also be a substrate itself, such as a wafer. Thus, when the substrate itself is the etching object layer 120, the substrate 110 may be omitted.

A first thickness H1 of the etching object layer 120 may vary according to the structure which is to be formed in the semiconductor device. For example, when a capacitor is formed, the etching object layer 120 may be formed to have a thickness of about 10000 Å to about 20000 Å. When the etching object layer 120 forms a VNAND channel, the etching object layer 120 may be formed to have a thickness of about 300,000 Å. Also, when a metal contact which is formed in most semiconductor devices is formed, the etching object layer 120 may be formed to have a maximum thickness of about 200,000 Å.

The substrate 110 may be a substrate based on a group IV material wafer, such as a silicon wafer, or a group III-V compound wafer. The substrate 110 may be formed of a single crystal wafer, such as a silicon single crystal wafer, in terms of a manufacturing method thereof. However, the substrate 110 is not limited to a single crystal wafer, and may be formed of various wafers, such as an epitaxial wafer, a polished wafer, an annealed wafer, and a silicon on insulator wafer. Here, the epitaxial wafer refers to a wafer in which a crystal material is grown on a single crystal silicon substrate.

The substrate 110 may be a wafer itself, as described above. However, the substrate 110 may include a wafer and at least one material layer formed on the wafer, according to the type of the semiconductor device which is to be fabricated. The substrate 110 may be doped with predetermined impurity ions.

Examples of structures having high aspect ratios may be a capacitor of DRAM, a VNAND channel, and a metal contact MC formed in various semiconductor devices. The structures having the high aspect ratios are not limited thereto. Currently, a capacitor has an aspect ratio that is equal to or higher than 60:1, and the VNAND channel may have an aspect ratio that is equal to or higher than 50:1. The metal contact MC is a structure generally included in a semiconductor device, and currently, a metal contact MC having an aspect ratio that is equal to or higher than 10:1 is applied to most semiconductor devices. Particularly, a metal contact MC 1 among the metal contact MC, which is connected to an active layer in a peri region, may be formed to have an aspect ratio that is equal to or higher than 50:1.

For reference, in a process of fabricating a semiconductor device, a hardmask with respect to which an etching object layer has a high selectivity is applied in a dry etching process, in order to form a structure having a high aspect ratio. Here, the selectivity (or the etching selectivity) may be defined as a ratio of an etching speed of an etching object layer against an etching speed of the hardmask. Thus, the etching object layer having the high selectivity with respect to the hardmask may denote that the hardmask has a much lower etch rate than the etching object layer with respect to a given etchant.

Generally, an amorphous carbon layer (ACL) or a spin on hardmask (SOH) layer containing a large amount of carbon or an undoped polysilicon layer may be used as the hardmask to etch the etching object layer, such as a lower oxide layer or nitride layer. However, when the above-described material layers are used as the hardmask, the hardmask may be completely consumed before the etching object layer is etched to a desired depth if there is not sufficient selectivity for the etching object layer as compared to the hardmask. In addition, if a thickness of the hardmask of the above-described material layers is increased to compensate for the lack in selectivity, the distribution of a pattern of the etching object layer may be deteriorated and it may be hard to etch the mask layer itself.

Hereinafter, for convenience of understanding, a mask layer refers to a layer before a pattern is formed, and a mask is referred to after the pattern is formed in the layer.

In more detail, the mask layer is patterned first to pattern the etching object layer. When the mask layer is thick, it may be difficult to pattern the mask layer. Also, when the mask is thick, the etching object layer may be distanced from a surface of the mask so that the etch uniformity of the etching object layer may be deteriorated. Accordingly, the distribution of the pattern of the etching object layer may be deteriorated.

With respect to the patterning method according to the present example embodiment, a metal or a metal-based material may be used as the mask. According to the present example embodiment, the lower metal layer 130 is formed on the etching object layer 120 and the lower metal layer 130 is used as the mask to pattern the etching object layer 120. Here, the lower metal layer 130 may include not only a metal but also a metal-based material, such as a metal compound. For example, the lower metal layer 130 may be a metal which may be etched by fluorine (F). For example, the lower metal layer 130 may be tungsten (W) or a metal including W. Materials of the lower metal layer 130 are not limited to the metal which may be etched by F, or the tungsten-based material. In addition, the etching of the metal by F may be performed according to a principle in which the metal reacts with F or an F compound to be changed into metal fluoride having a low boiling point to be removed.

The lower metal layer 130 may have a much higher selectivity than a non-metallic hardmask. That is, with respect to etching object layer 120, the lower metal layer 130 may have a much lower etch rate than the non-metallic hardmask. Accordingly, the lower metal layer 130 having a lower thickness than the non-metallic hardmask may be used as the mask. A second thickness H2 of the lower metal layer 130 may vary according to a thickness and a selectivity of the etching object layer 120. For example, when the etching selectivity of the etching object layer 120 with respect to the lower metal layer 130 is equal to or higher than 10, and a first thickness H1 of the etching object layer 120 is about 20000 Å, the second thickness H2 of the lower metal layer 130 may be approximately equal to or lower than 2500 Å. Using the mask, such as the lower metal layer 130, the etching object layer 120 may be easily etched to a desired depth and the above-described deterioration of the distribution due to the use of the non-metallic hardmask, may be reduced or eliminated.

Also, in the patterning method according to the present example embodiment, another metal layer, that is, the upper metal layer 140 may be used to pattern the lower metal layer 130. In more detail, to use the lower metal layer 130 as the mask, the lower metal layer 130 is patterned first. In the patterning method according to the present example embodiment, the lower metal layer 130 may be patterned using the upper metal layer 140, which is heterogeneous with the lower metal layer 130.

In general, an oxide layer or a nitride layer may be used as a mask to pattern a metal layer. However, when the oxide layer or the nitride layer is used as the mask, the selectivity of the metal layer with respect to the oxide layer or the nitride layer may be low, and thus, the oxide layer or the nitride layer may be formed to have substantially the same thickness as that of the metal layer. For example, when, with respect to an etchant used to etch the metal layer, a maximum etching selectivity of the metal layer with respect to the oxide layer is 2 (that is, with respect to the etchant, an etch rate of the metal layer is 2 and an etch rate of the oxide layer is 1), and a thickness of the metal layer to be etched is 2500 Å, the oxide layer has to be formed to have a thickness of 3750/2+500≈2400 Å, since the metal layer is to be etched by 3750 (2500*1.5) Å considering an overetching of about 50%, and 500 Å of the oxide layer is to remain after the etching. Thus, it is understood that when the oxide layer is used as the mask, the oxide layer is formed to have substantially the same thickness as the metal layer, which is the object of the etching, or a greater thickness than the metal layer.

When the oxide layer or the nitride layer is used as the mask to etch the lower metal layer 130, small CD or distribution deterioration of the lower metal layer 130 may occur, due to a large thickness of the oxide layer or the nitride layer. Also, the lower metal layer 130 may not be fully etched, which may cause a N/O (not open) wherein a lower portion of the lower metal layer 130 is not exposed.

In the patterning method according to the present example embodiment, the upper metal layer 140 may be used to pattern the lower metal layer 130. Here, the upper metal layer 140 may include the metal-based material layer like the lower metal layer 130. The upper metal layer 140 is a metal layer which is different from the lower metal layer 130, and may be a metal layer having an etching selectivity with respect to the lower metal layer 130. For example, with respect to an etchant, the upper metal layer 140 may have a low etch rate because it is difficult to be etched and the lower metal layer 130 may have a high etch rate because it is easy to be etched. On the contrary, with respect to another etchant, the upper metal layer 140 may have a high etch rate because it is easy to be etched, and the lower metal layer 130 may have a low etch rate because it is difficult to be etched.

For example, when the lower metal layer 130 is formed of a tungsten-based metal as described above, the upper metal layer 140 may be formed of titanium (Ti) or a titanium-based metal, such as titanium nitride (TiN). According to the present example embodiment, the tungsten-based metal has a low boiling point with respect to a fluorine (F) product and is easily etched by fluorine (F). Also, the tungsten-based metal has a high boiling point with respect to a chlorine (Cl) product and is not easily etched by chlorine (Cl). Also, the titanium-based metal has a low boiling point with respect to a chlorine (Cl) product and is easily etched by chlorine (Cl) Also, the titanium-based metal has a high boiling point with respect to a fluorine (F) product and is not easily etched by fluorine (F). For reference, that a metal has a high or low boiling point with respect to a fluorine or chlorine product denotes that a metal compound which is generated by reacting the metal with fluorine (F) or a fluorine (F) compound, or chlorine (Cl) or a chlorine (Cl) compound has a high boiling point or a low boiling point.

Thus, when a titanium-based upper metal layer 140 is used as the mask and fluorine or the fluorine compound is used as an etchant, a tungsten-based lower metal layer 130 may be easily etched using the relatively thin upper metal layer 140 as the mask. A third thickness H3 of the upper metal layer 140 may vary according to a thickness and an etching selectivity of the lower metal layer 130. For example, when fluorine or the fluorine compound is used as the etchant, an etching selectivity of the titanium-based upper metal layer 140 with respect to the tungsten-based lower metal layer 130 may be equal to or higher than 7. Accordingly, when the second thickness H2 of the tungsten-based lower metal layer 130 is equal to or lower than 2500 Å, the third thickness H3 of the upper metal layer 140, which is required for the etching of the lower metal layer 130, may be equal to or lower than 400 Å.

When the titanium-based metal is used as the lower metal layer 130 and the tungsten-based metal is used as the upper metal layer 140, the above described effect may be obtained using chlorine or a chlorine compound as the etchant.

Although the tungsten-based metal or the titanium-based metal is exemplified as the lower metal layer 130 or the upper metal layer 140, other materials may be used for the lower metal layer 130 and the upper metal layer 140. For example, various metals or metal compounds varying in etch selectivities with respect to etchants may be used in the lower metal layer 130 and the upper metal layer 140. In addition, a buffer layer may be further formed between the lower metal layer 130 and the upper metal layer 140 to strengthen adhesion therebetween. The buffer layer will be described in more detail by referring to FIGS. 3A and 3B.

A hardmask layer 150 may be formed on the upper metal layer 140 to pattern the upper metal layer 140. For example, the hardmask layer 150 may be formed of an ACL or an SOH layer containing a large amount of carbon. A fourth thickness H4 of the hardmask layer 150 may vary according to a thickness and an etching selectivity of the upper metal layer 140.

In the patterning method according to the present example embodiment, the upper metal layer 140 is formed to be relatively thin, and thus, the hardmask layer 150 may be also formed to be relatively thin. If an oxide layer or a nitride layer is used as an upper mask to etch the lower metal layer 130, the upper mask may be formed to be very thick, and to etch the thick upper mask, the thickness of the hardmask layer 150 may be greater than the thickness of the upper mask. In the patterning method according to the present example embodiment, the upper metal layer 140 may be formed to be very thin, for example, to have a thickness of equal to or lower than one fifth of the thickness of the upper mask, such as the oxide layer or the nitride layer. Accordingly, the hardmask layer 150 may be also formed to be relatively thin. The thickness of the hardmask layer 150 may be greater than the thickness of the upper metal layer 140.

Figure 2B:
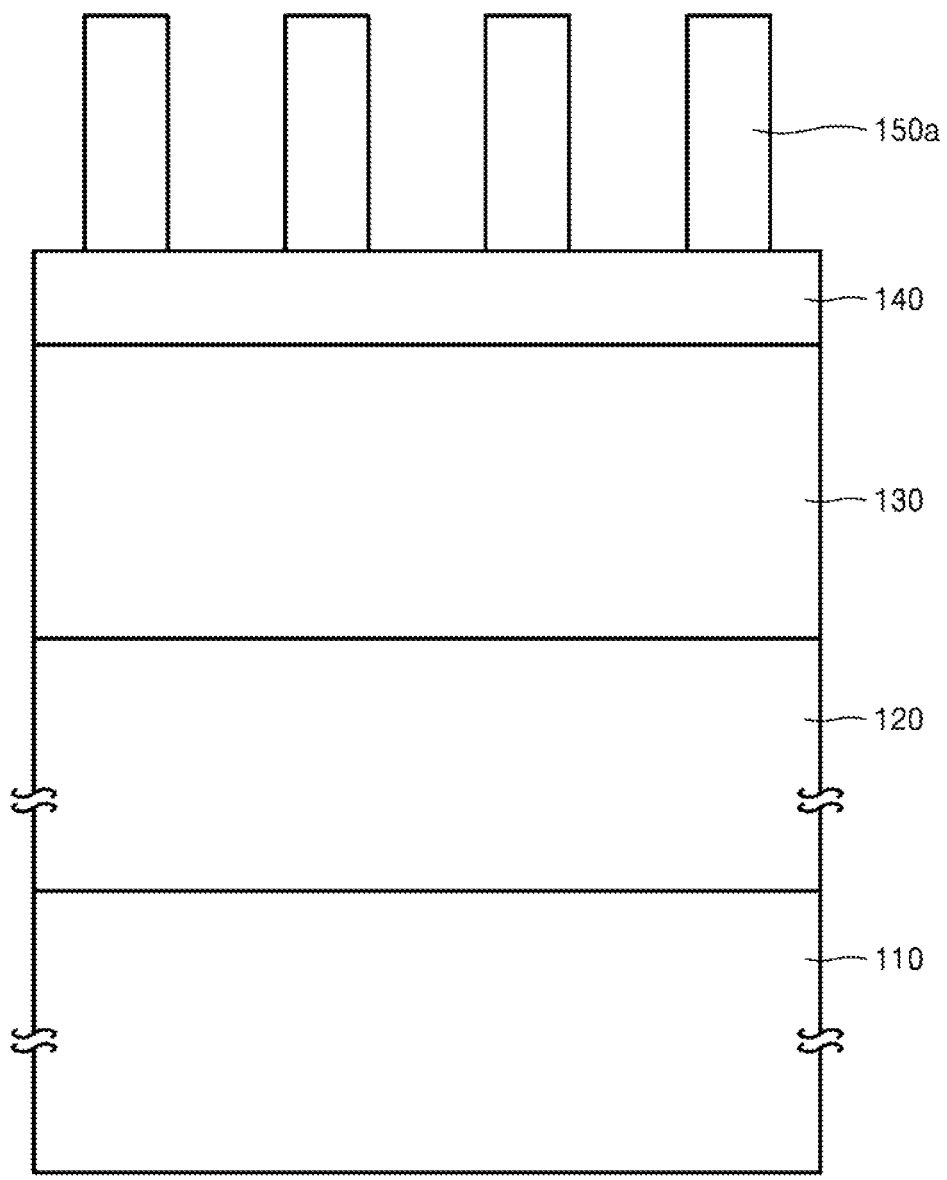

Referring to FIG. 2B, the hardmask layer 150 may be patterned using a photoresist (PR) layer to form a hardmask 150a. In more detail, first, the photoresist layer is formed on the hardmask layer 150, and then, light exposure and development are performed on the photoresist layer to form a photoresist pattern. Then, the hardmask layer 150 is patterned using the photoresist pattern to form the hardmask 150a as illustrated in FIG. 2B.

Figure 2C:
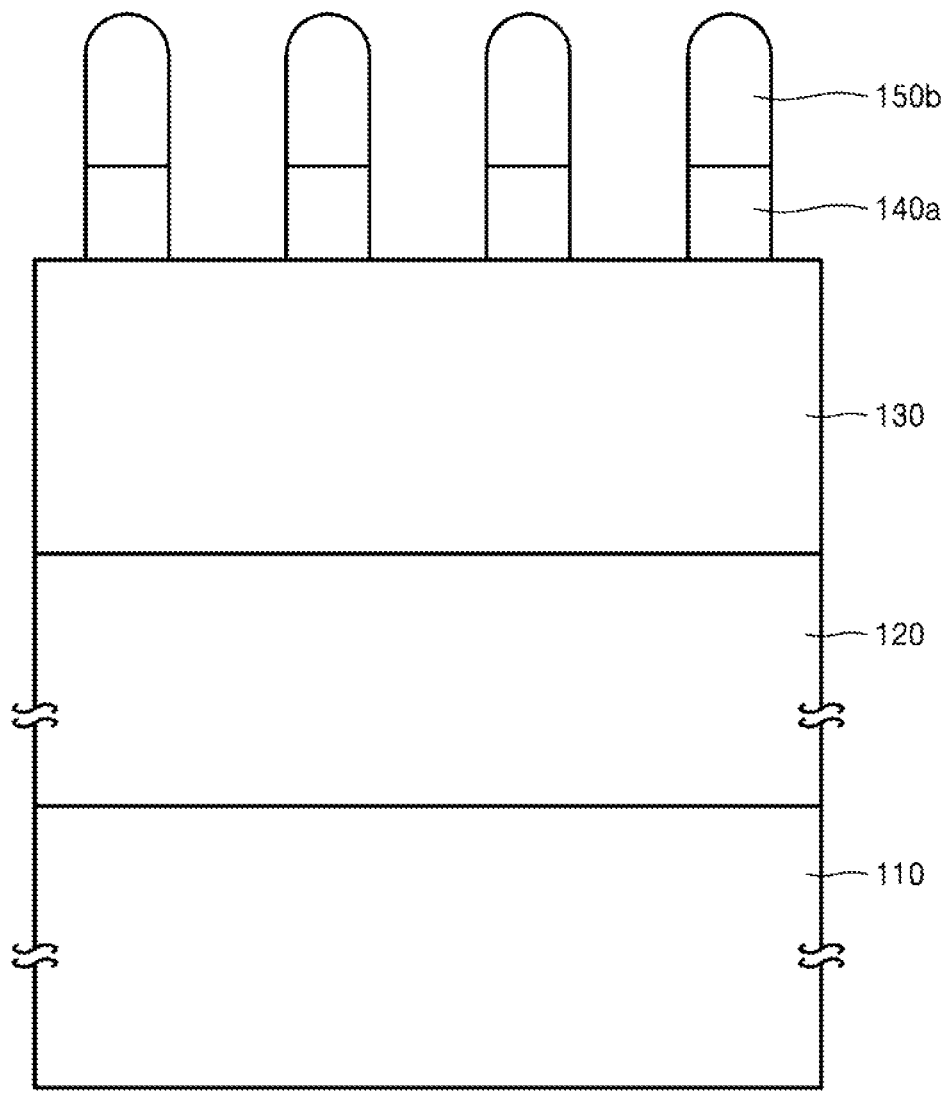

Referring to FIGS. 1 and 2C, after the hardmask 150a is formed, the upper metal layer 140 is patterned using the hardmask 150a to form an upper metal mask 140a, in operation S120. As described above, the upper metal layer 140 may be formed to be relatively thin. Thus, the upper metal layer 140 may be relatively easily and uniformly etched using the hardmask 150a, and thus, the upper metal mask 140a having a uniform pattern may be formed.

After the upper metal mask 140a is formed, a hardmask 150b may remain on the upper metal mask 140a. The hardmask 150b may have a round upper portion by being etched during the etching of the upper metal layer 140, as illustrated in FIG. 2C.

Figure 2D:
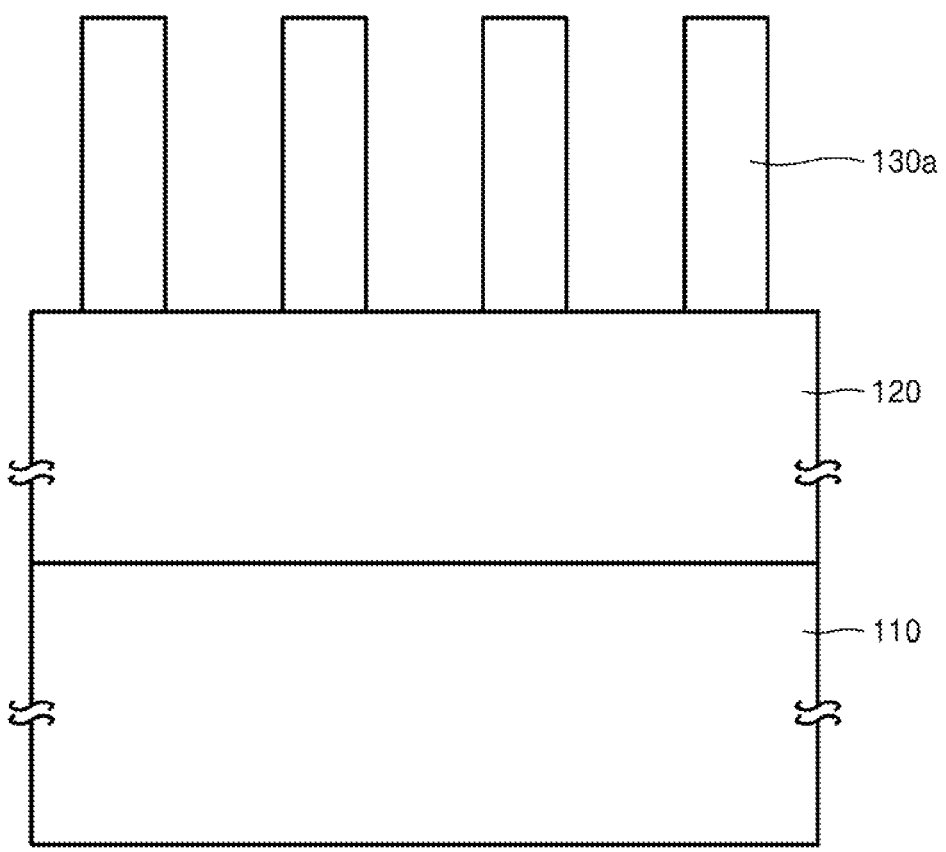

Referring to FIGS. 1 and 2D, a lower metal mask 130a is formed by patterning the lower metal layer 130 using the upper metal mask 140a, in operation S130. As described above, since the etching selectivity of the lower metal layer 130 with respect to the upper metal layer 140 is high, the lower metal layer 130 which is relatively thick may be easily and uniformly patterned using the upper metal mask 140a which is thin. For example, when the upper metal layer 140 is formed of the titanium-based metal and the lower metal layer 130 is formed of the tungsten-based metal, the lower metal layer 130 may be easily etched using an etchant, such as fluorine or a fluorine compound having an active fluorine species.

In another implementation, the upper metal layer 140 is formed of the tungsten-based material and the lower metal layer 130 is formed of the titanium-based material. In this case, the lower metal 130 may be etched using an etchant, such as chlorine or a chlorine compound having an active chlorine species.

The upper metal mask 140a may remain on the lower metal mask 130a. The remaining upper metal mask 140a may function as an etch mask along with the lower metal mask 130a, when the etching object layer 120 is etched. Depending on the case, the upper metal mask 140a may not remain. For example, when significant etching is performed on the lower metal layer 130, the upper metal mask 140a may be largely or entirely eliminated.

Figure 2E:
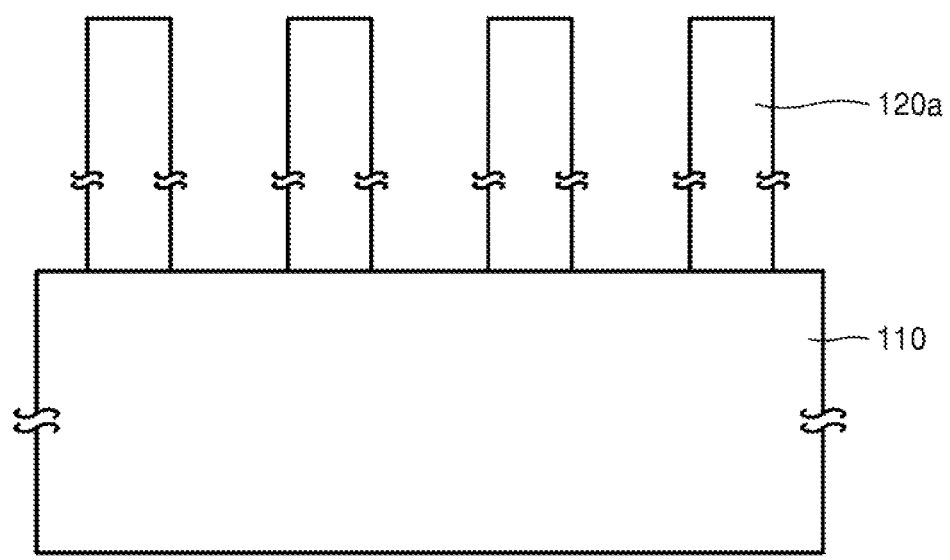

Referring to FIGS. 1 and 2E, an etching object layer pattern 120a may be formed by patterning the etching object layer 120 using the lower metal mask 130a, in operation S140. As described above, the etching selectivity of the etching object layer 120 with respect to the lower mask layer 130 is very high, and a pattern having a high aspect ratio, for example, a through-hole having a high aspect ratio, may be easily and uniformly formed in the etching object layer 120.

The through-hole having a high aspect ratio formed in the etching object layer pattern 120a may be, for example, a through-hole for forming a capacitor in DRAM, a through-hole for forming a vertical channel in VNAND, or a through-hole for a metal contact having a high aspect ratio which is applied to most semiconductor devices. Also, the through-hole having the high aspect ratio may be a through-hole for forming a through silicon via (TSV), or various other applications of the through-hole having a high aspect ratio.

With respect to the etching object layer pattern 120a including the pattern having a high aspect ratio, various sequential semiconductor processes may be performed. After the sequential semiconductor processes are performed, a desired semiconductor device may be manufactured. Individual processes for manufacturing the semiconductor device will be described in more detail by referring to FIGS. 9 through 11.

In the patterning method using a metal mask according to the present example embodiment, a first metal layer (lower metal layer) is used to pattern the etching object layer 120, and a second metal layer (upper metal layer) of a different material is used to pattern the first metal layer. Using such heterogeneous metal layers as the mask may have following effects:

First, since the etching selectivity of the etching object layer 120 with respect to the first metal layer is very high, compared to the etching selectivity of the etching object layer 120 with respect to other non-metallic masks, the first metal layer may be formed sufficiently thin to be used as the mask. Accordingly, the distribution deterioration of the etching object layer pattern, the N/O of the lower portion of the etching object layer, and the etching difficulty of the mask layer itself may be mitigated.

Second, since the heterogeneous second metal layer with respect to which the first metal layer has a high selectivity is used with respect to a selected etchant, the second metal layer may be formed very thin and the first metal layer may be easily etched. Accordingly, the small CD, the distribution deterioration, and the N/O of the first metal layer may be mitigated. Also, the thickness of the hardmask, which is formed above the second metal layer to pattern the second metal layer, may be greatly reduced.

Third, when the relatively thick first metal layer is etched, a side wall passivation process and an etching process may be repeatedly performed. Here, since the second metal layer is formed very thin, the side wall passivation process may be easily performed and the profile control may be easy.

Figure 3A:
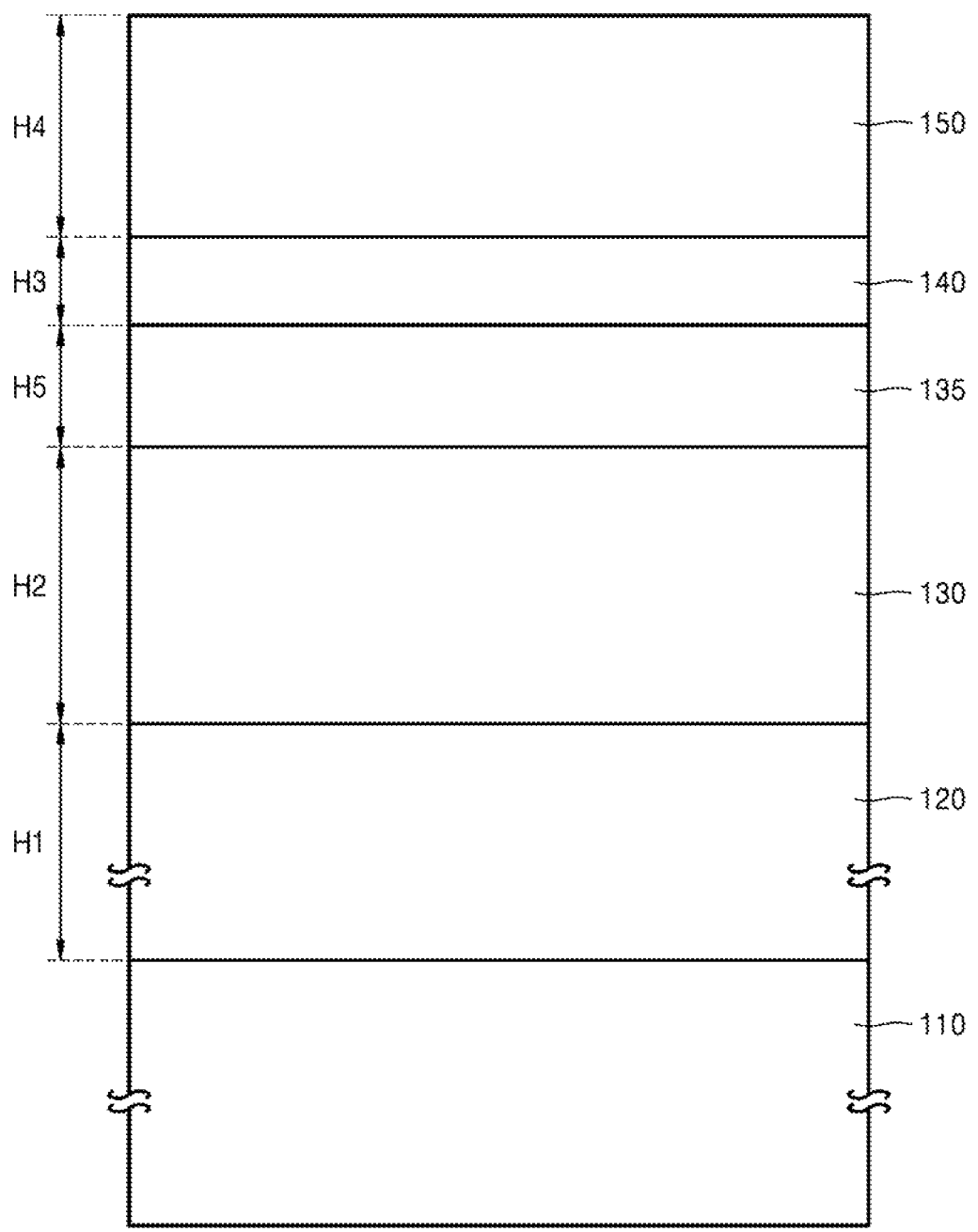
FIGS. 3A and 3B illustrate cross-sectional views for describing a patterning method using a metal mask, according to an example embodiment.
Figure 3B:
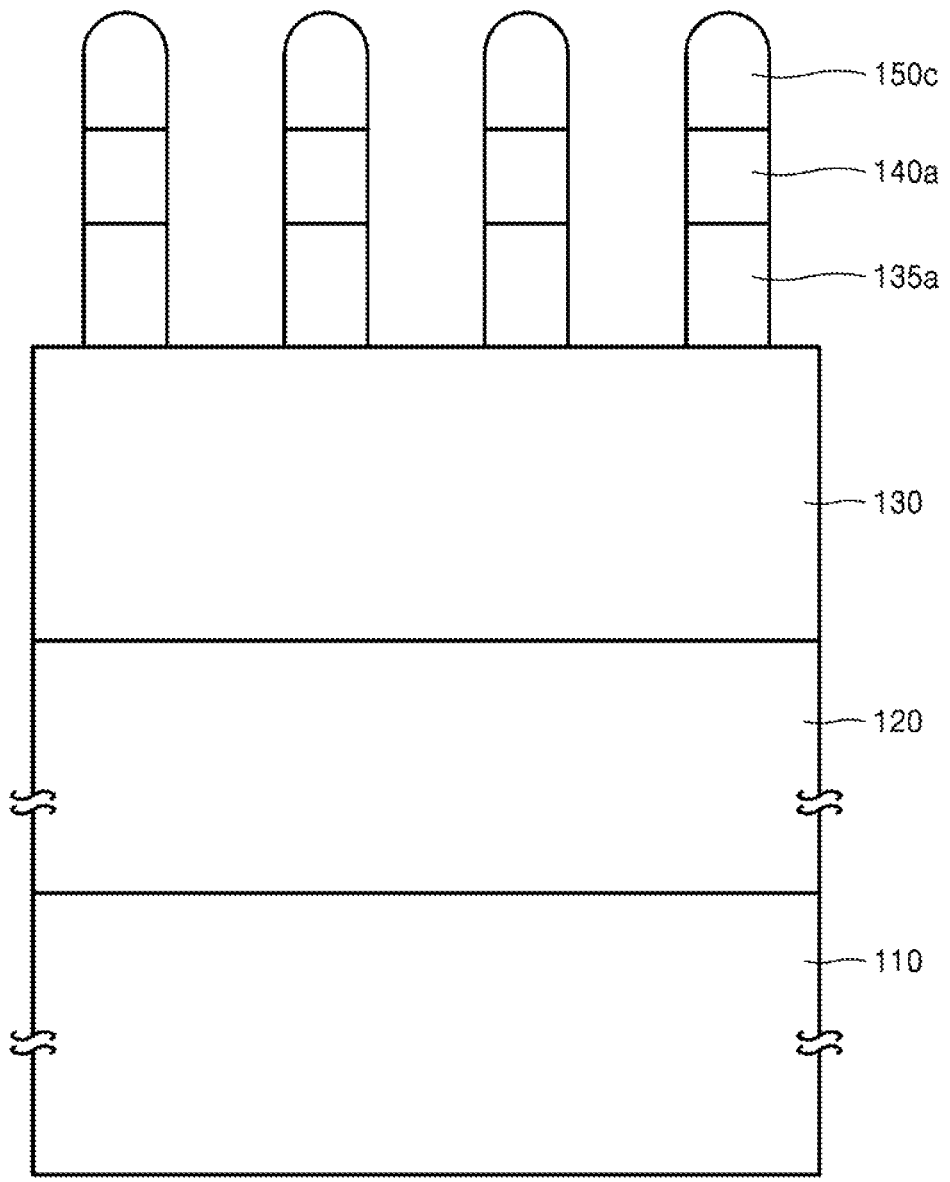

FIGS. 3A and 3B are cross-sectional views for describing a patterning method using a metal mask, according to another example embodiment. FIG. 3A may correspond to FIG. 2A and FIG. 3B may correspond to FIG. 2C.

Referring to FIG. 3A, in the patterning method using a metal mask according to the present example embodiment, a buffer layer 135 may further be formed between the lower metal layer 130 and the upper metal layer 140. The buffer layer 135 may be formed to strengthen adhesion between the lower metal layer 130 and the upper metal layer 140. Also, the buffer layer 135 may ease a lattice mismatch between the lower metal layer 130 and the upper metal layer 140.

The buffer layer 135 may be formed of, for example, silicon (Si), silicon nitride ($Si_3N_4$), or silicon oxide ($SiO_2$). The buffer layer 135 may be formed to be thicker than the upper metal layer 140. For example, a fifth thickness H5 of the buffer layer 135 may be about 500 to about 2000 Å. After the buffer layer 135 is formed, the upper metal layer 140 and the hardmask layer 150 are formed on the buffer layer 135.

Referring to FIG. 3B, the hardmask 150a (refer to FIG. 2B) is formed by patterning the hardmask layer 150 using the photoresist layer. After the hardmask 150a is formed, the upper metal layer 140 is patterned using the hardmask 150a to form the upper metal mask 140a. Also, the buffer layer 135 is patterned to form a buffer pattern 135a. As illustrated in FIG. 3B, since etching is further performed with respect to the buffer layer 135, a thickness of a hardmask 150c may become even smaller than that of the hardmask 150b of FIG. 2C. According to cases, the hardmask 150c may be almost consumed during the process of forming the buffer pattern 135a. Then, the etching object layer 120 is patterned by performing the etching processes as illustrated in FIGS. 2D and 2E. However, in the process of forming the lower metal mask 130a, the upper metal mask 140a and the buffer pattern 135a together may be used as the etch mask.

Figure 4A:
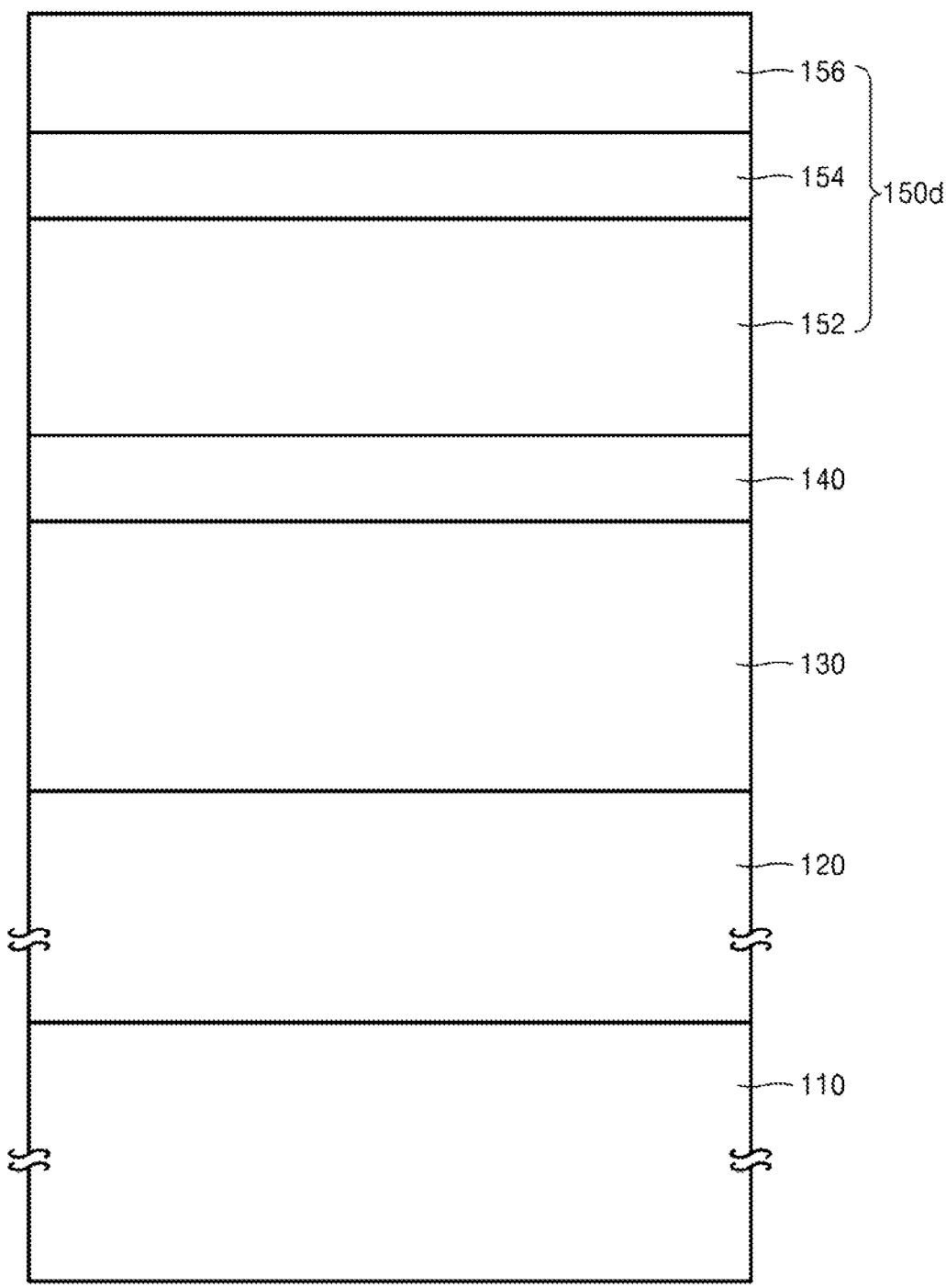
FIGS. 4A and 4B illustrate cross-sectional views for describing a process of patterning an upper metal layer, according to an example embodiment.
Figure 4B:
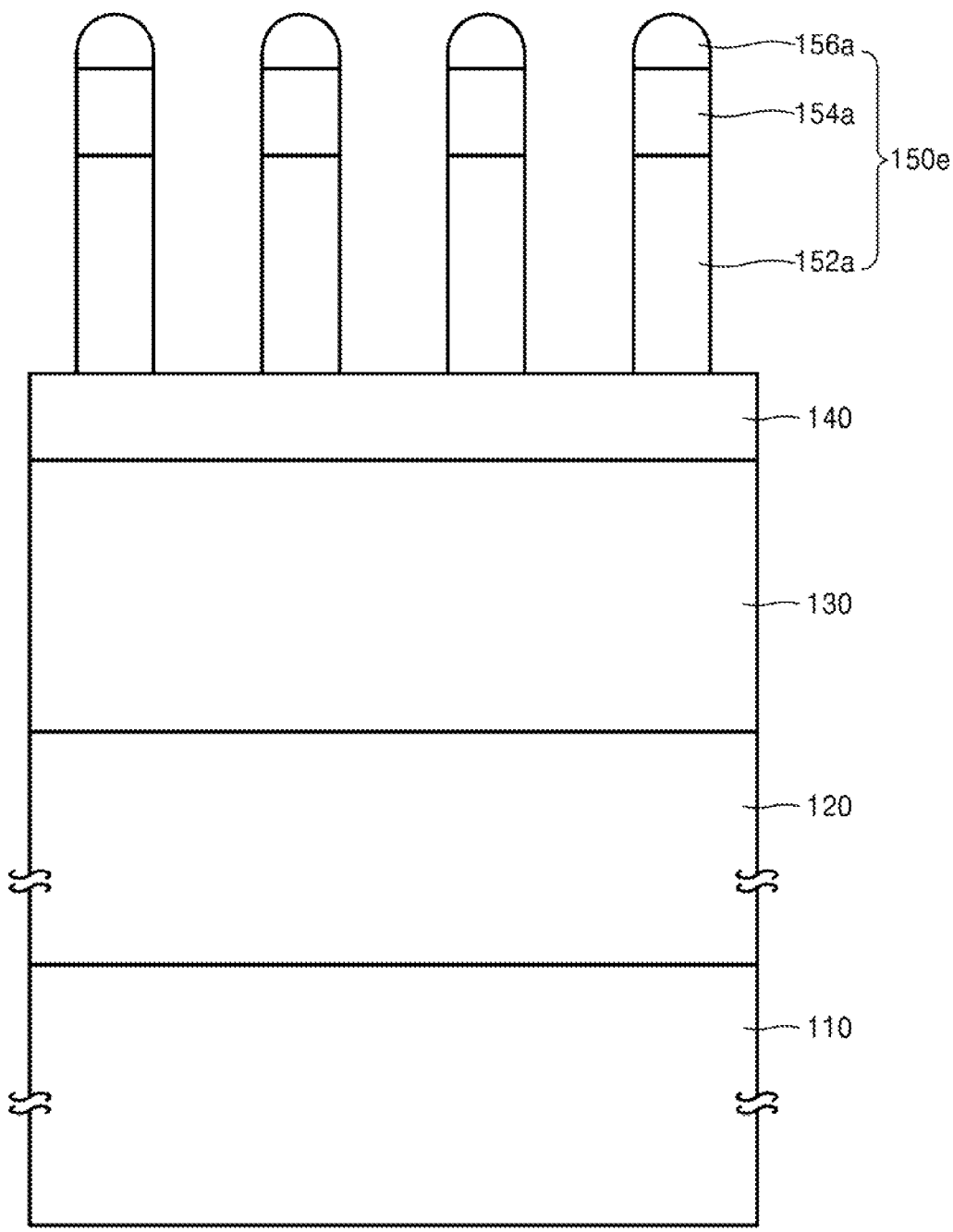

FIGS. 4A and 4B are cross-sectional views for describing a patterning method using a metal mask, and more particularly, for describing a process of patterning an upper metal layer, according to another example embodiment.

Referring to FIG. 4A, in the patterning method using a metal mask, according to the present example embodiment, a hardmask layer 150d may be formed as multiple layers. As illustrated, the hardmask layer 150d may be formed as a triple layer including a first hardmask layer 152, a second hardmask layer 154, and a third hardmask layer 156. In other implementations, the hardmask layer 150d may be formed as a double layer, or as a quadruple layer or more.

The first hardmask layer 152 may be formed of an ACL or an SOH layer containing a large amount of carbon. The second and third hardmask layers 154 and 156 may be material layers used in a double patterning process. For example, the second hardmask layer 154 may be an SiON layer and the third hardmask layer 156 may be an ACL or an SOH layer. Meanwhile, when the upper metal layer 140 is formed to have a thickness of equal to or less than 400 Å, the first hardmask layer 152 may be formed to have a thickness of about 1200 Å, the second hardmask layer 154 may be formed to have a thickness of about 260 Å, and the third hardmask layer 156 may be formed to have a thickness of about 800 Å, to etch the upper metal layer 140.

When an oxide layer, instead of the upper metal layer 140, is used to etch the lower metal layer 130, the oxide layer may be fainted to have a thickness of approximately equal to or greater than 2500 Å, and to etch the oxide layer of such a thickness, the first hardmask layer 152 may be formed to have a thickness of about 2400 Å, the second hardmask layer 154 may be formed to have a thickness of about 400 Å, and the third hardmask layer 156 may be formed to have a thickness of about 1100 Å. Thus, it is understood that the thickness of the hardmask layer 150d may be greatly decreased by using the upper metal layer 140.

Although materials and thicknesses of the hardmask layer 150d are described, these are merely examples, and other materials and thicknesses may also be applied to the hardmask layer 150d.

Referring to FIG. 4B, a hardmask 150e is formed by patterning the hardmask layer 150d using a photoresist layer. In more detail, first, the photoresist layer is formed on the hardmask layer 150d, and light exposure and development processes are performed on the photoresist layer to form a photoresist pattern. Then, the third hardmask layer 156 is patterned using the photoresist pattern, and the second hardmask layer 154 and the first hardmask layer 152 are patterned using the third hardmask layer 156 to form the hardmask 150e as illustrated in FIG. 4B.

The hardmask 150e may include, for example, a first hardmask 152a, a second hardmask 154a, and a third hardmask 156a. In the case of the third hardmask 156a, an upper portion of the third hardmask 156a may have a round shape as illustrated in FIG. 4B, since a part of the upper portion of the third hardmask layer 156 is etched when the second hardmask layer 154 and the first hardmask layer 152 are etched. Then, an upper metal mask 140a is formed by etching the upper metal layer 140 using the hardmask 150e, a lower metal mask 130a is formed by etching the lower metal layer 130 using the upper metal mask 140a, and the etching object layer 120 is patterned using the lower metal mask 130a. The forming of the upper metal mask 140a and the lower metal mask 130a and the patterning of the etching object layer 120 are the same as described with reference to FIGS. 1 and 2A through 2E.

FIGS. 5A through 5D are cross-sectional views for describing a patterning method using a metal mask, and particularly, for describing a process of patterning a lower metal layer, according to another example embodiment.

Figure 5A:
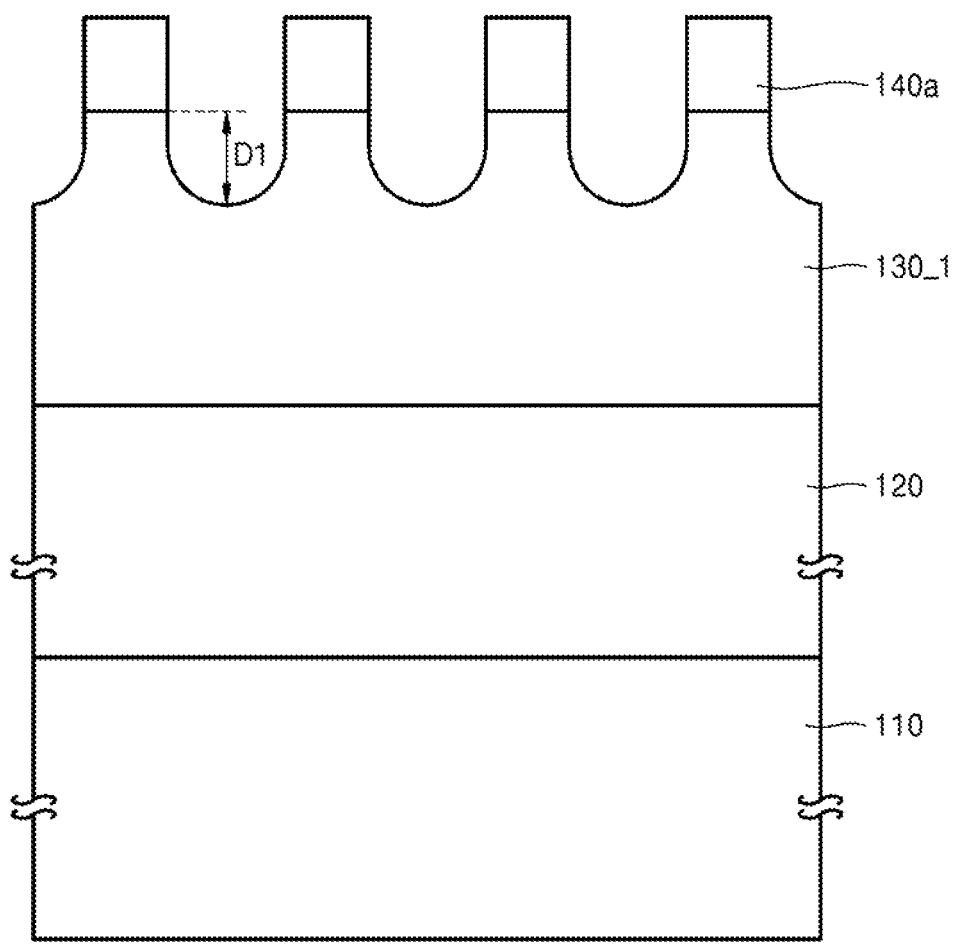
FIGS. 5A through 5D illustrate cross-sectional views for describing a process of patterning a lower metal layer, according to an example embodiment.

Referring to FIG. 5A, first, the lower metal layer 130 is etched for the first time to a first depth D1 using the upper metal mask 140a. For example, the upper metal mask 140a is a titanium-based metal, the lower metal layer 130 is a tungsten-based metal layer, and fluorine or a fluorine compound may be used as an etchant.

For reference, when etching is continuously performed on a lower metal layer 130_1 to more than a predetermined depth, a side wall of the lower metal layer 130_1 may be excessively etched. Accordingly, the lower metal layer 130_1 may not be etched at once to form a pattern, and a process for preventing the etching of the side wall may be used.

Figure 5B:
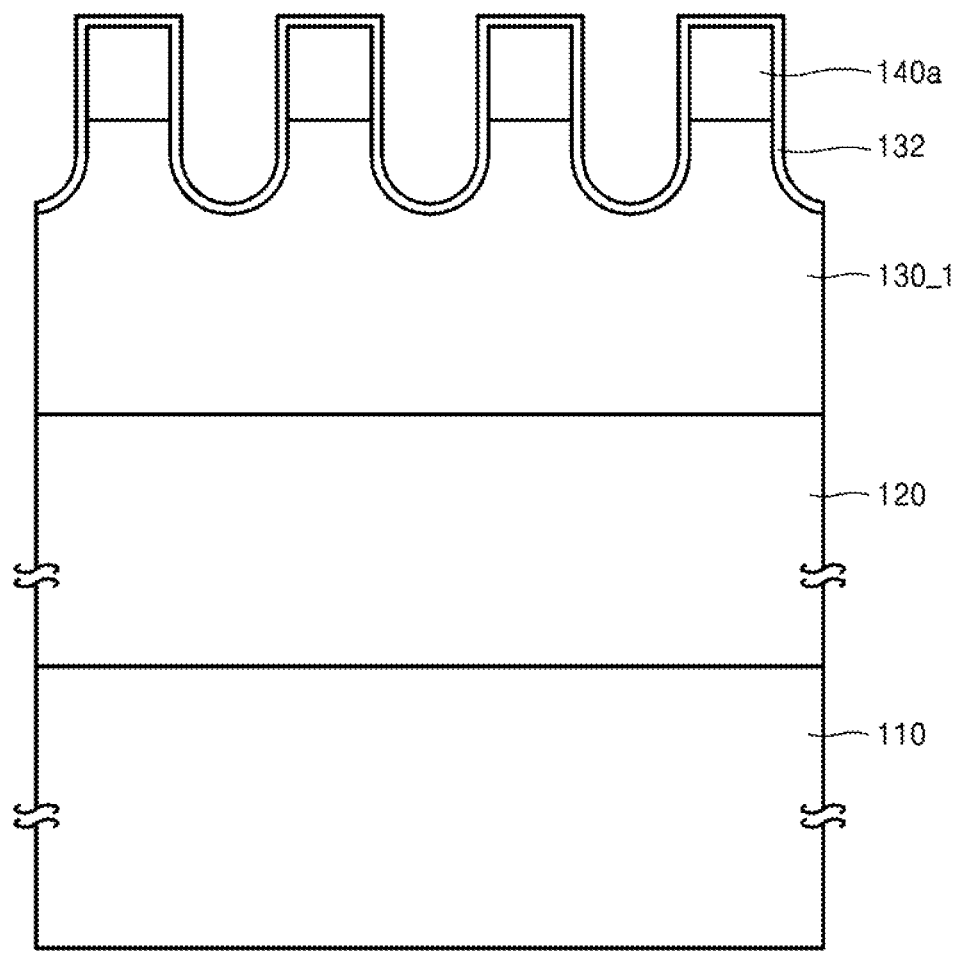

Referring to FIG. 5B, after the lower metal layer 130_1 is etched for the first time to a first depth D1, a passivation layer 132 is formed on the upper metal mask 140a and the exposed lower metal layer 130_1 by a deposition process. The passivation layer 132 may be formed as an oxide layer or a nitride layer. For example, the passivation layer 132 may be formed as a silicon oxide ($SiO_2$) layer. The passivation layer 132 may prevent the side wall of the lower metal layer 130_1 from being excessively etched.

Figure 5C:
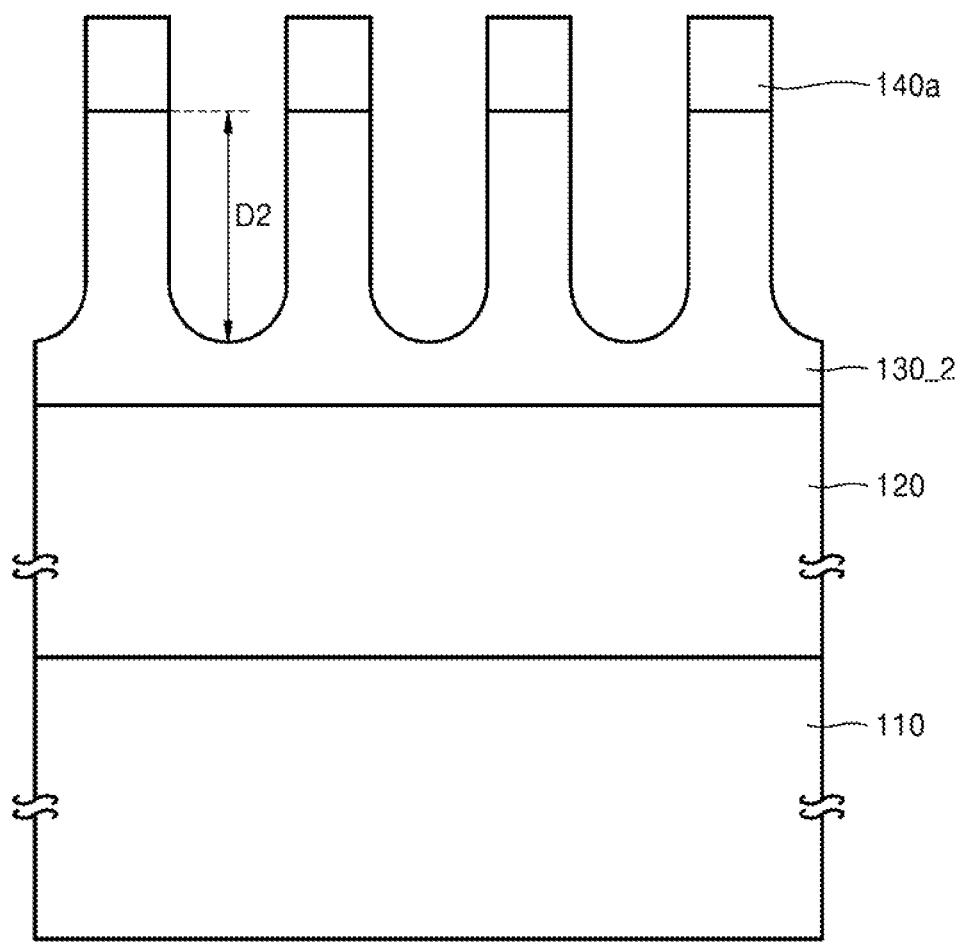

Referring to FIG. 5C, after the passivation layer 132 is formed, a second etching process is performed to etch a lower metal layer 130_2 to a second depth D2. During the second etching process, the passivation layer 132 may be also etched to be removed. Although FIG. 5C does not illustrate the passivation layer 132, a portion of the passivation layer 132 may remain on the upper metal mask 140a and the lower metal layer 130_2. That is, considering that the passivation layer 132 may prevent the side wall of the lower metal layer 130_2 from being excessively etched, a portion of the passivation layer 132 may remain on the lower metal layer 130_2.

Figure 5D:
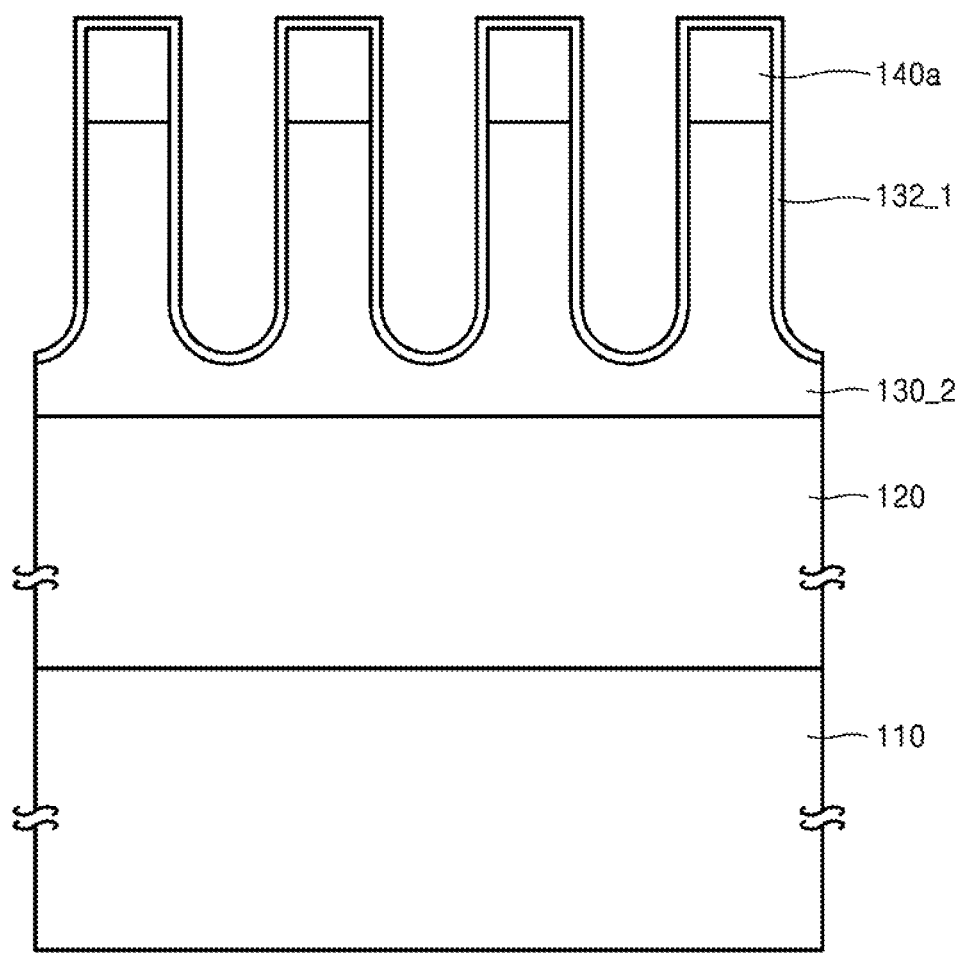

Referring to FIG. 5D, after the lower metal layer 130_2 is etched for the second time to the second depth D2, a passivation layer 132_1 is again formed on the upper metal mask 140a and the exposed lower metal layer 130_2. Then, until the etching object layer 120 is exposed, etching of a lower metal layer and deposition of a passivation layer are repeatedly performed.

For reference, in the deposition process for forming a passivation layer, a deposition capacity may be largely dependent on an aspect ratio of a hole formed. Thus, when the aspect ratio of the hole is very large, deposition may not be sufficiently performed on a deep portion of the hole. Accordingly, the side wall passivation process may be difficult. Also, in the case of the hole having a high aspect ratio, etching capacity decreases in the deep portion of the hole, and thus, it may be difficult to control a profile of the hole. These issues may become more significant when a non-metallic mask formed as an oxide layer or a nitride layer is used to etch the lower metal layer 130. That is, in the case of the non-metallic mask, the mask is formed very thick and the thickness of the non-metallic mask accounts for a part of an aspect ratio during the process of etching the lower metal layer 130.

However, in the patterning method according to the present example embodiment, the upper metal mask 140a is used to etch the lower metal layer 130 and the upper metal mask 140a may be formed very thin compared to the non-metallic mask. Thus, the aspect ratio of the hole may become significantly reduced, and the difficulties of lowering the deposition or etching capacity in the deep portion of the hole may be mitigated. Therefore, the patterning method according to the present example embodiment may mitigate difficulties in the side wall passivation process or in the controlling of the profile of the hole.

Figure 6:
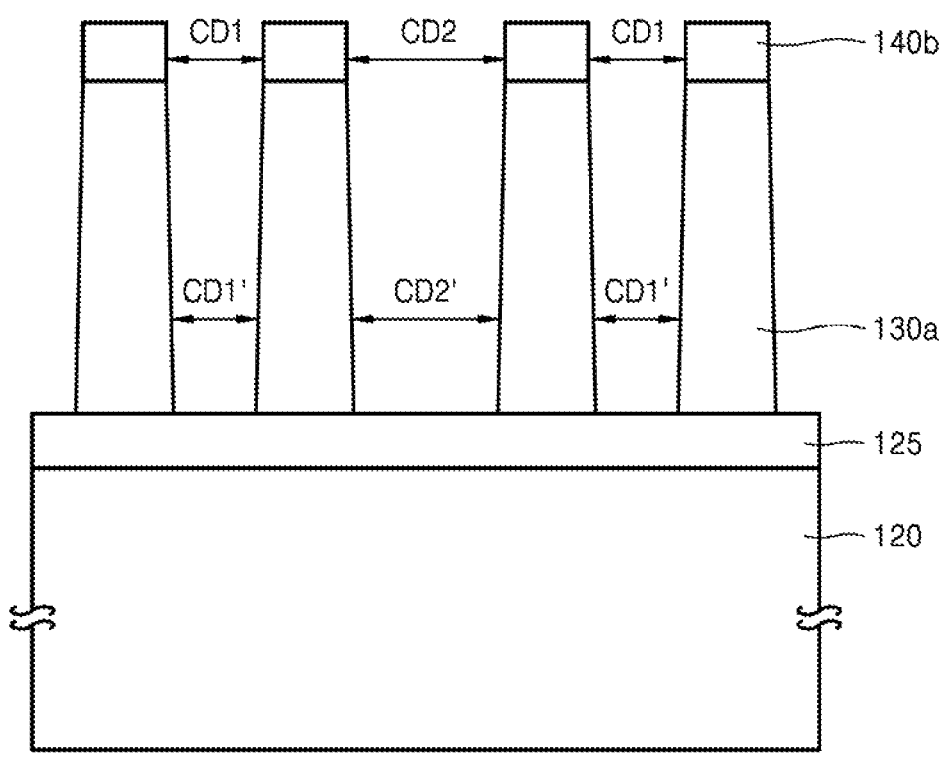
FIG. 6 illustrates a cross-sectional view for describing an effect of a case in which an etch stop layer is included, according to an example embodiment.

FIG. 6 is a cross-sectional view for describing a patterning method using a metal mask, and more particularly, for describing an effect of a case in which an etch stop layer is included.

Referring to FIG. 6, an etch stop layer 125 may be formed below the lower metal mask 130a, that is, above the etching object layer 120. An etching selectivity of the lower metal layer 130 with respect to the etch stop layer 125 may be very high. In other words, an etch rate of the lower metal layer 130 may be much higher than an etch rate of the etch stop layer 125. Accordingly, in the process of etching the lower metal layer 130, the etch stop layer 125 may be almost not etched. By depositing the etch stop layer 125 below the lower metal mask 130a, an N/O problem of the lower metal layer 130 may be mitigated, and also a pattern profile that approximately has a vertical shape may be formed.

In more detail, assuming that a first hole having a first width CD1, which is small, and a second hole having a second width CD2, which is large, are formed in the lower metal layer 130, etching may be performed more quickly on the second hole than on the first hole so that the etching object layer 120 may be quickly exposed, while etching may be performed slowly on the first hole so that the etching object layer 120 may be slowly exposed. If the etching is continuously performed until the etching object layer 120 is exposed through the first hole, a portion of the etching object layer 120, which is exposed through the second hole, may be etched or damaged due to an etchant. Also, when the etching process is ended to prevent the damage in or the etching of the etching object layer 120, the profile of the first hole may worsen or an N/O problem may occur in the first hole.

However, when the etching object layer 120 is protected by forming the etch stop layer 125 on the lower portion of the lower metal layer 130, the etching process may be continuously performed until the etching object layer 120 is exposed through the first hole and also until the pattern profile that approximately has a vertical shape is formed. Thus, the N/O problem may be mitigated and the hole having a profile that approximately has a vertical shape may be formed. To represent this using an equation, when the etch stop layer 125 does not exist, the following equation is realized: $|CD1-CD1'|\gg|CD2-CD2'|$. However, when the etch stop layer 125 exists, the following equation is realized: $|CD1-CD1'|\approx|CD2-CD2'|$.

The etch stop layer 125 may be formed of a metal-based material heterogeneous with that of the lower metal layer 130. Also, the etch stop layer 125 may be formed of a material having an etching selectivity with respect to the lower metal layer 130. For example, the etch stop layer 125 may be formed of the metal-based material homogeneous with that of the upper metal layer 140. However, if the etch stop layer 125 has the etching selectivity with respect to the lower metal layer 130, the etch stop layer 125 may be formed of a metal-based material heterogeneous with that of the upper metal layer 140.

Figure 7:
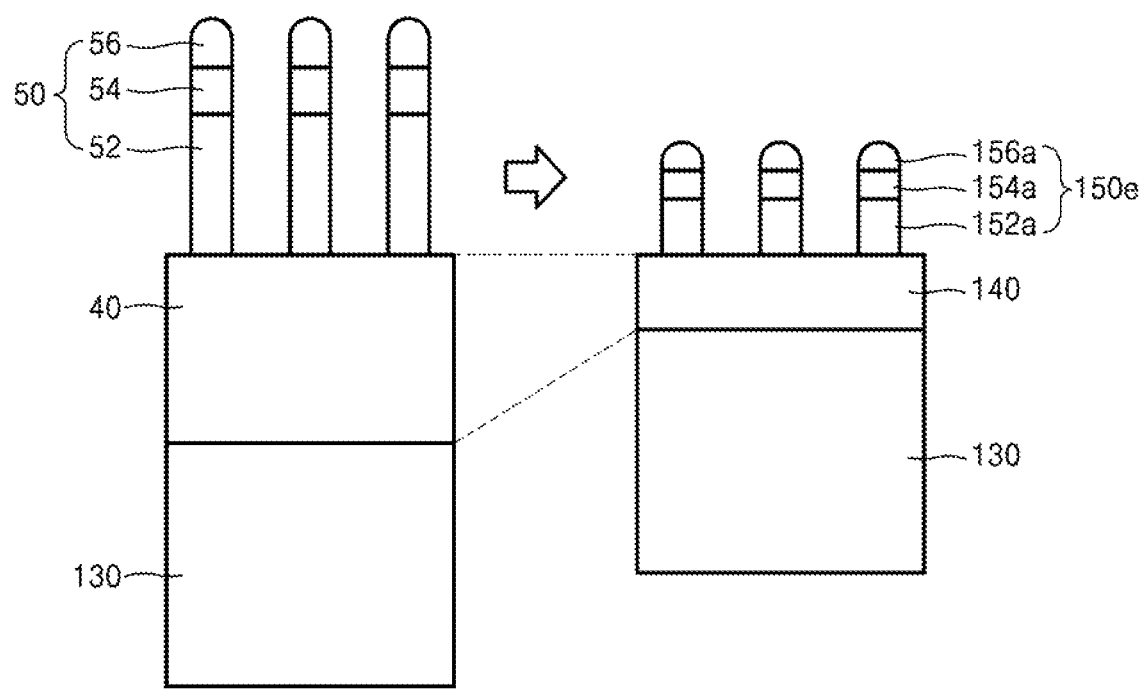
FIG. 7 illustrates a cross-sectional view for describing effects of a case in which an oxide layer or a nitride layer is used as a mask to etch a lower metal layer and a case in which a heterogeneous upper metal layer is used as the mask to etch the lower metal layer.

FIG. 7 is a cross-sectional view for describing effects of a case in which an oxide layer or a nitride layer 40 is used as a mask to etch a lower metal layer and a case in which a heterogeneous upper metal layer 140 is used as the mask to etch the lower metal layer.

Referring to FIG. 7, when as illustrated on the left side, the oxide layer or the nitride layer 40 is used as the mask to etch the lower metal layer 130, the oxide layer or the nitride layer 40 may be formed very thick, and also the hardmask 50 may be formed very thick to etch the oxide layer or the nitride layer 40. However, when as illustrated on the right side, the heterogeneous upper metal layer 140 is used as the mask to etch the lower metal layer 130, the upper metal layer 140 may be formed very thin and also the hardmask 150e may be formed very thin to etch the upper metal layer 140. Here, first hardmasks 52 and 152a, second hardmasks 54 and 154a, and third hardmasks 56 and 156a forming hardmasks 50 and 150e may be the same as described with reference to FIGS. 4A and 4B.

For example, by assuming that the lower metal layer 130 having a thickness of about 2500 Å is etched, the oxide layer 40, which is used as the mask, may be formed to have a thickness of equal to or greater than about 2500 Å and the hardmask 50 may be formed to have a thickness of about 4000 Å. When the upper metal layer 140 is used as the mask, the upper metal layer 140 may be formed to have a thickness of equal to or less than about 400 Å and the hardmask 150e may be formed to have a thickness of about 1300 Å. Thus, it is understood that when the upper metal layer 140 is used as the mask, the total thickness may be significantly reduced.

FIGS. 8 through 11 are flowcharts of a method of fabricating a semiconductor device, which includes a patterning method using a metal mask, according to an example embodiment. For convenience of understanding, descriptions will be made by also referring to FIGS. 2A through 2E. Also, for convenience of explanation, aspects already described with reference to FIGS. 1 through 7 will be described briefly or will not be repeatedly described.

Figure 8:
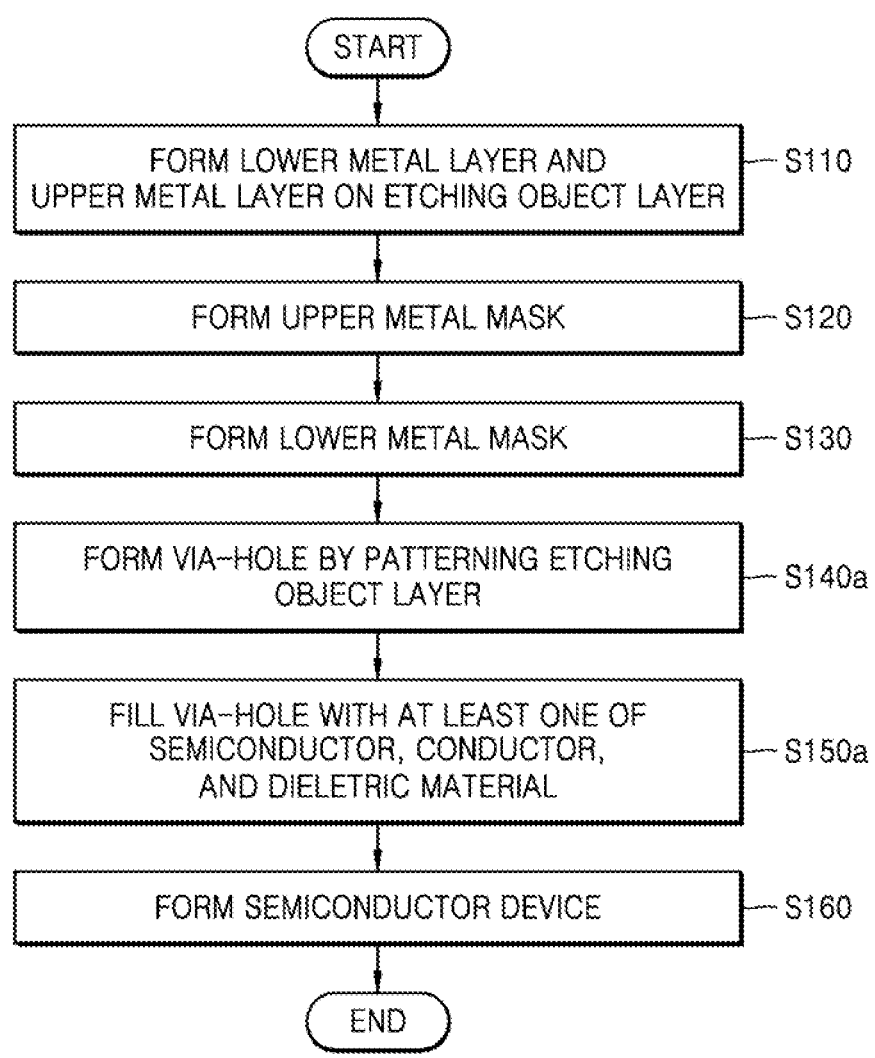
FIGS. 8 through 11 illustrate flowcharts of a method of fabricating a semiconductor device, which includes a patterning method using a metal mask, according to an example embodiment.

Referring to FIG. 8, descriptions of forming the lower metal layer 130 and the upper metal layer 140 on the etching object layer 120 in operation S110, forming the upper metal mask 140a in operation S120, and forming the lower metal mask 130a in operation S130 are the same as the ones provided with reference to FIG. 1. However, the upper metal mask 140a and the lower metal mask 130a may include a hole pattern to form a hole in the etching object layer 120. The hole pattern may have, for example, a circular cylindrical shape, an elliptic cylindrical shape, or a polygonal cylindrical shape.

A through-hole is formed in the etching object layer 120 by patterning the etching object layer 120 using the lower metal mask 130a in operation S140a. The through-hole may have, for example a circular cylindrical shape, an elliptic cylindrical shape, or a polygonal cylindrical shape according to a hole pattern of the lower metal mask 130a. The through-hole of the etching object layer 120 may be, for example, a through-hole for forming a capacitor in DRAM, a through-hole for forming a vertical channel in VNAND, or a through-hole for forming a metal contact having a high aspect ratio which is applied to most semiconductor devices. Also, the through-hole having a high aspect ratio may be a through-hole for forming a TSV, etc.

At least one of a semiconductor, a conductor, and a dielectric material is filled in the through-hole in operation S150a. For example, the semiconductor material may be filled in the through-hole to form a channel in the VNAND. A metal may be spread on an inner wall of the through-hole to form a lower electrode in DRAM. Also, a metal material may be filled in the through-hole to form the metal contact or the TSV. The metal contact or the TSV may be formed such that a barrier metal layer is formed in the inner wall of the through-hole and a wiring metal layer is formed on the barrier metal layer.

After the at least one of the semiconductor, the conductor, and the dielectric material is filled in the through-hole, a desired semiconductor device is manufactured in operation S160. That is, various sequential semiconductor processes may be performed according to the semiconductor device to be manufactured, to complete the semiconductor device. The sequential semiconductor processes may include various processes, such as a photo process, a deposition process, an etching process, and a cleaning process. According to cases, a test process may also be included in the sequential semiconductor processes.

Figure 9:
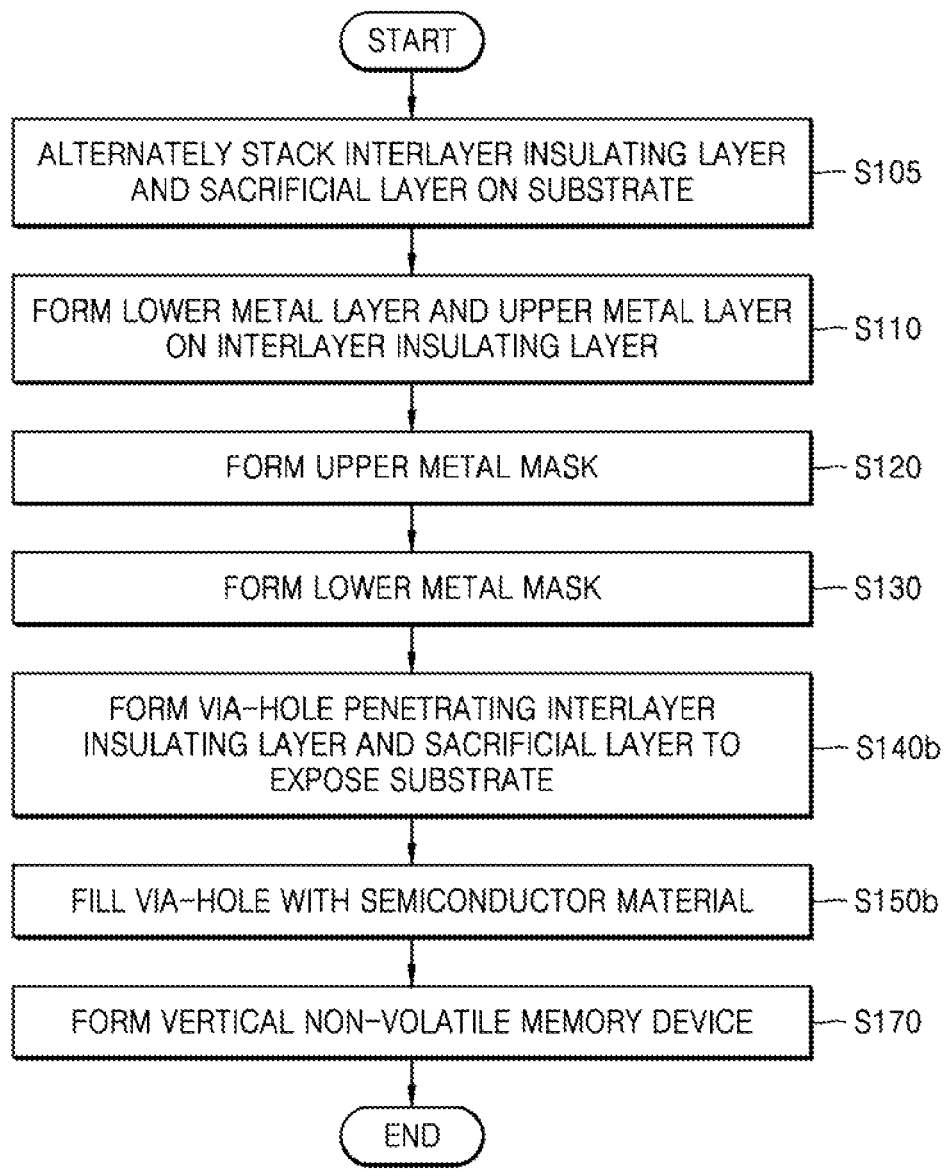

Referring to FIG. 9, a plurality of interlayer insulating layers and sacrificial layers are alternately stacked on the substrate 110 in operation S105. The plurality of interlayer insulating layers and sacrificial layers may be the etching object layer 120. The plurality of interlayer insulating layers and sacrificial layers may be used to form a vertical non-volatile memory device. For example, the plurality of sacrificial layers may be layers which are substituted with a plurality of gate electrodes via a metal replacement process. The plurality of interlayer insulating layers may be layers which electrically insulate the plurality of gate electrodes.

Forming of the lower metal layer 130 and an upper metal layer 140 on the interlayer insulating layer in operation S110 through forming of the lower metal mask 130a in operation S130 are the same as described with reference to FIG. 1. However, the lower metal layer 130 may be formed on the interlayer insulating layer which is an uppermost layer as the etching object layer 120.

After the lower metal mask 130a is formed, a through-hole penetrating the plurality of interlayer insulating layers and sacrificial layers and exposing the substrate 110 is formed in operation S140b. That is, the plurality of interlayer insulating layers and sacrificial layers may be etched by an etching process using the lower metal mask 130a as a mask, to form the through-hole exposing the substrate 110. Here, the through-hole may be a through-hole for forming a vertical channel in VNAND.

Then, a semiconductor material is filled in the through-hole in operation S150b. Here, the semiconductor material may be, for example, polysilicon or single crystal silicon, etc. The semiconductor material may not be doped or the semiconductor material may include p-type or n-type impurities.

The semiconductor material may be formed as a uniform thickness in the through-hole using ALD or CVD. For example, the semiconductor material may be formed as a column shape such as a pillar, by being filled in the whole through-hole. However, the semiconductor material may be formed as a hollow shape in which the semiconductor material is formed thinly at the bottom and on the side wall of the through-hole, and the inner portion of the through-hole is filled with an insulating layer.

After the semiconductor material is filled in the through-hole, sequential semiconductor processes may be performed to form the vertical non-volatile memory device in operation S170. The vertical non-volatile memory device may be, for example, the VNAND. To briefly describe the sequential semiconductor processes, an opening penetrating the plurality of interlayer insulating layers and sacrificial layers and extending in a certain direction in a line shape is formed in a portion different from the portion in which the through-hole is formed. The plurality of sacrificial layers are removed through the opening and a conductive material, such as tungsten, is filled in the portion of the removed sacrificial layers to form a gate electrode. After a common source line is formed on the substrate 110 below the opening, the opening is filled with an insulating material. Then, wiring such as a contact line and a bit line is formed to complete a non-volatile memory device.

Figure 10:
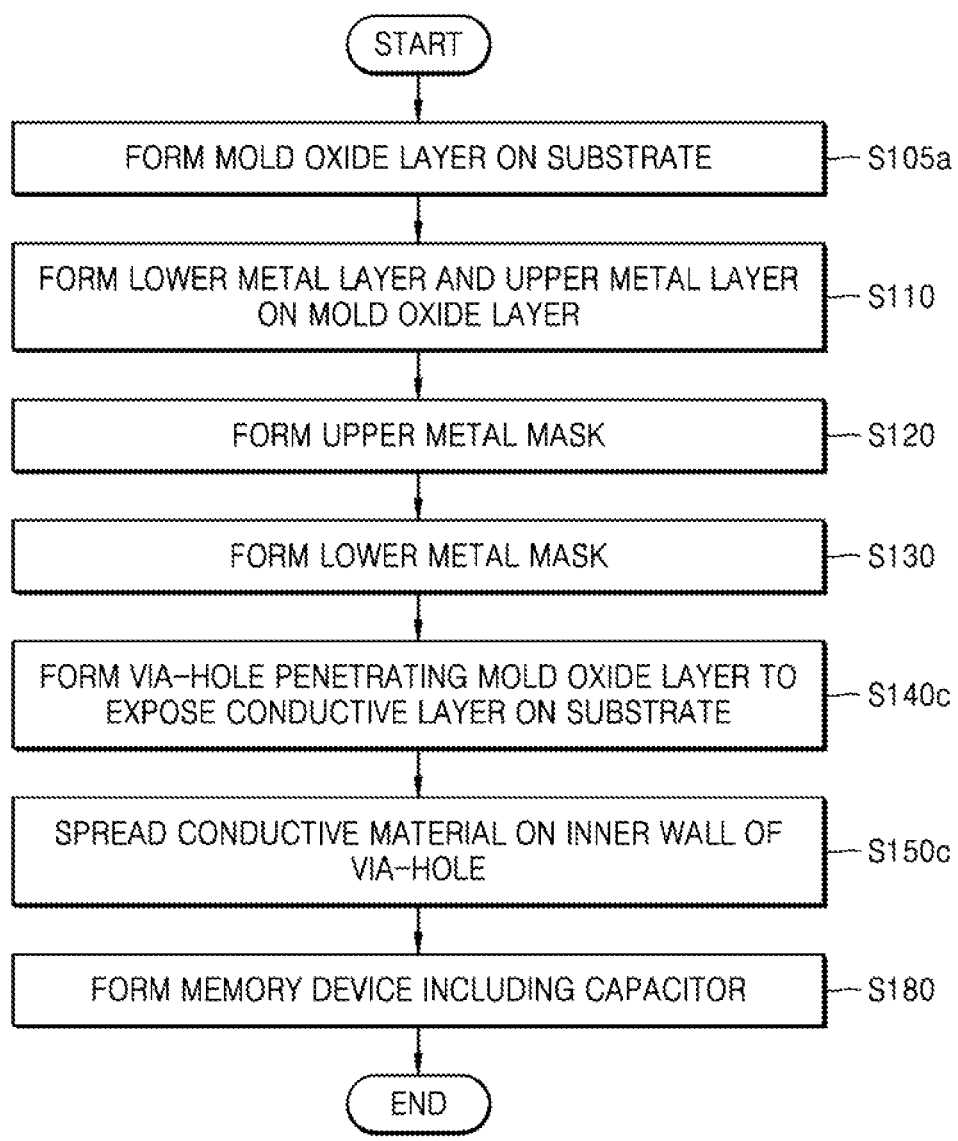

Referring to FIG. 10, a mold oxide layer is formed on the substrate 110 in operation S105*a*. The mold oxide layer is the etching object layer 120 and may function as a sacrificial layer for forming a capacitor in DRAM. The mold oxide layer may be formed of any one of various oxide layers, such as $SiO_2$, HDP, TEOS, LHTEOS, BPSG, etc.

Forming of the lower metal layer 130 and the upper metal layer 140 on the mold oxide layer in operation S110 through forming of the lower metal mask 130*a* in operation S130 is the same as described with reference to FIG. 1. However, the lower metal layer 130 may be formed on the mold oxide layer which is the etching object layer 120.

After the lower metal mask 130*a* is formed, a through-hole penetrating the mold oxide layer to expose a conductive layer on the substrate 110 is formed in operation S140*c*. Here, the conductive layer is a layer electrically connecting a conductive region in the substrate 110 and a lower electrode of the capacitor, and may be, for example, a contact plug. In general, a plurality of conductive layers may be formed in a shape in which the plurality of conductive layers are surrounded by the interlayer insulating layer. Also, an etch stop layer is formed on the conductive layer and the interlayer insulating layer, and the mold oxide layer may be formed on the etch stop layer. Thus, the through-hole may be formed by penetrating the etch stop layer.

Then, a conductive material is spread on the inner wall of the through-hole in operation S150*c*. Here, the conductive material may be a material forming the lower electrode of the capacitor. The conductive material may be, for example, a precious metal layer, such as Pt, Ru, or Ir, a precious metal conductive oxide layer, such as PtO, $RuO_2$, or $IrO_2$, a conductive oxide layer, such as SRO, BSRO, or LSCo, a high melting point metal layer, such as Ti, TiN, W, WN, Ta or TaN, etc. The conductive material may be formed in a uniform thickness in the through-hole.

After the through-hole is filled with the conductive material, sequential semiconductor processes may be performed to form a memory device including the capacitor, for example, to form DRAM in operation S180. To briefly describe the sequential semiconductor processes, a node separation process is performed after the lower electrode is formed. The mold oxide layer is removed and a dielectric layer and an upper electrode are formed on the lower electrode, to complete the memory device including the capacitor. According to cases, the process of manufacturing DRAM may also include a process of forming a capacitor supporter to prevent a collapse of the lower electrode of the capacitor.

Figure 11:
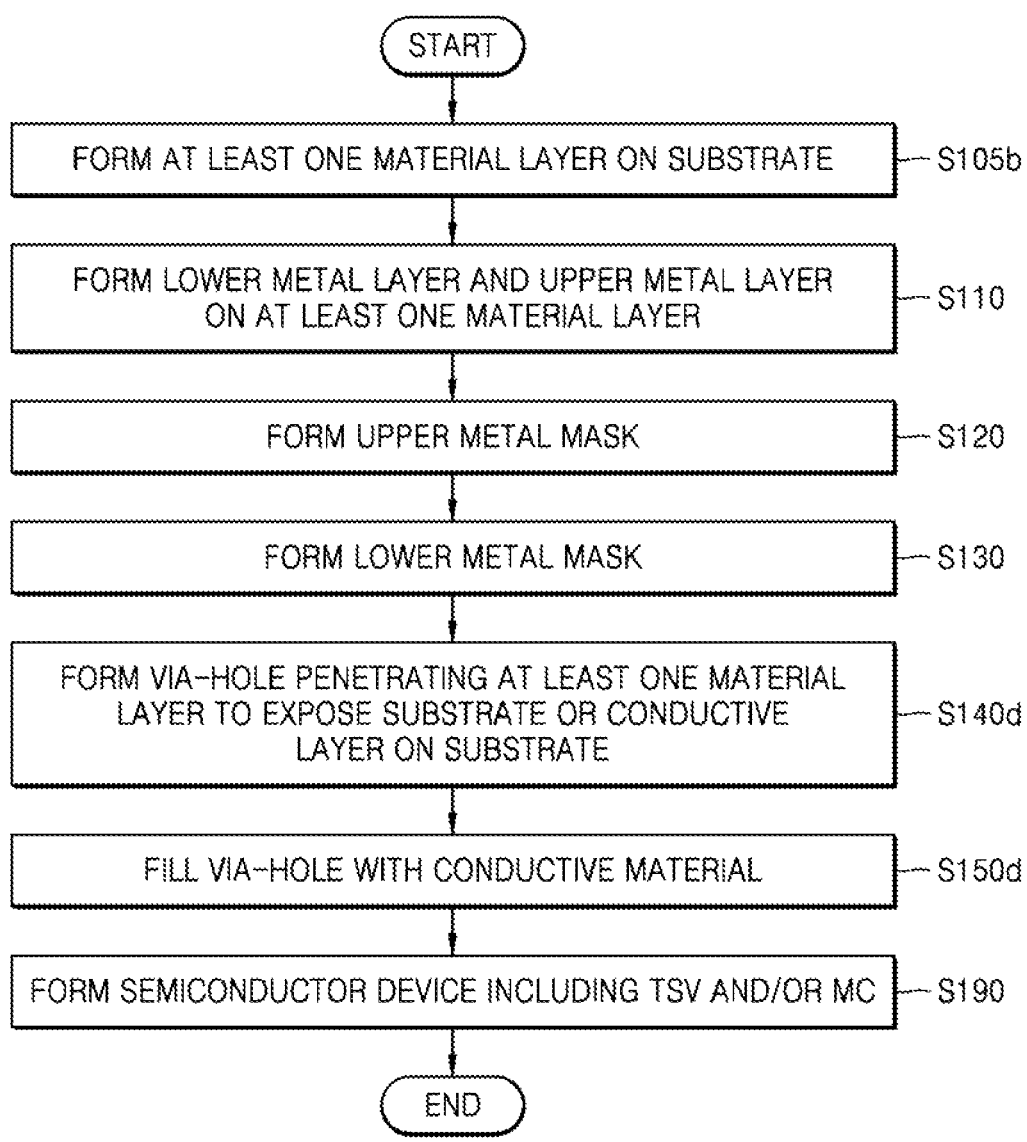

Referring to FIG. 11, at least one material layer is formed on the substrate 110 in operation S105*b*. The at least one material layer is the etching object layer 120, and in general, may be formed of an insulating material, such as an oxide layer or a nitride layer. However, according to cases, the at least one material layer may be formed of a semiconductor material or a conductive material. Material layers may not be formed on the substrate and the substrate itself may be the etching object layer.

Forming of the lower metal layer 130 and the upper metal layer 140 on the at least one material layer in operation S110 through forming of the lower metal mask 130*a* in operation S130 is the same as described with reference to FIG. 1. However, the lower metal layer 130 may be formed on the at least one material layer which is the etching object layer 120.

After the lower metal mask 130*a* is formed, a through-hole penetrating the at least one material layer and exposing the substrate or the conductive layer on the substrate is formed in operation S140*d*. Here, the conductive layer may refer to all of conductive material layers, such as a conductive region, wiring, and electrodes. When the substrate is exposed, the substrate may refer to a wafer itself, such as a silicon wafer.

Then, a conductive material is spread in the through-hole in operation S150*d*. Here, the conductive material may be a metal-based material forming metal contacts MC included in most semiconductor devices. Also, the conductive material may be a metal-based material forming TSV. Also, the conductive material may include a material forming a barrier metal layer and a wiring metal layer.

After the conductive material is filled in the through-hole, sequential semiconductor processes are performed to form a semiconductor device including a TSV and/or an MC in operation S190. Here, the semiconductor device may refer to all semiconductor devices including an MC. Also, the semiconductor device may refer to all semiconductor devices including a TSV, and the semiconductor devices including a TSV may be used in a semiconductor package of a multi-layered semiconductor chip structure.

Figure 12:
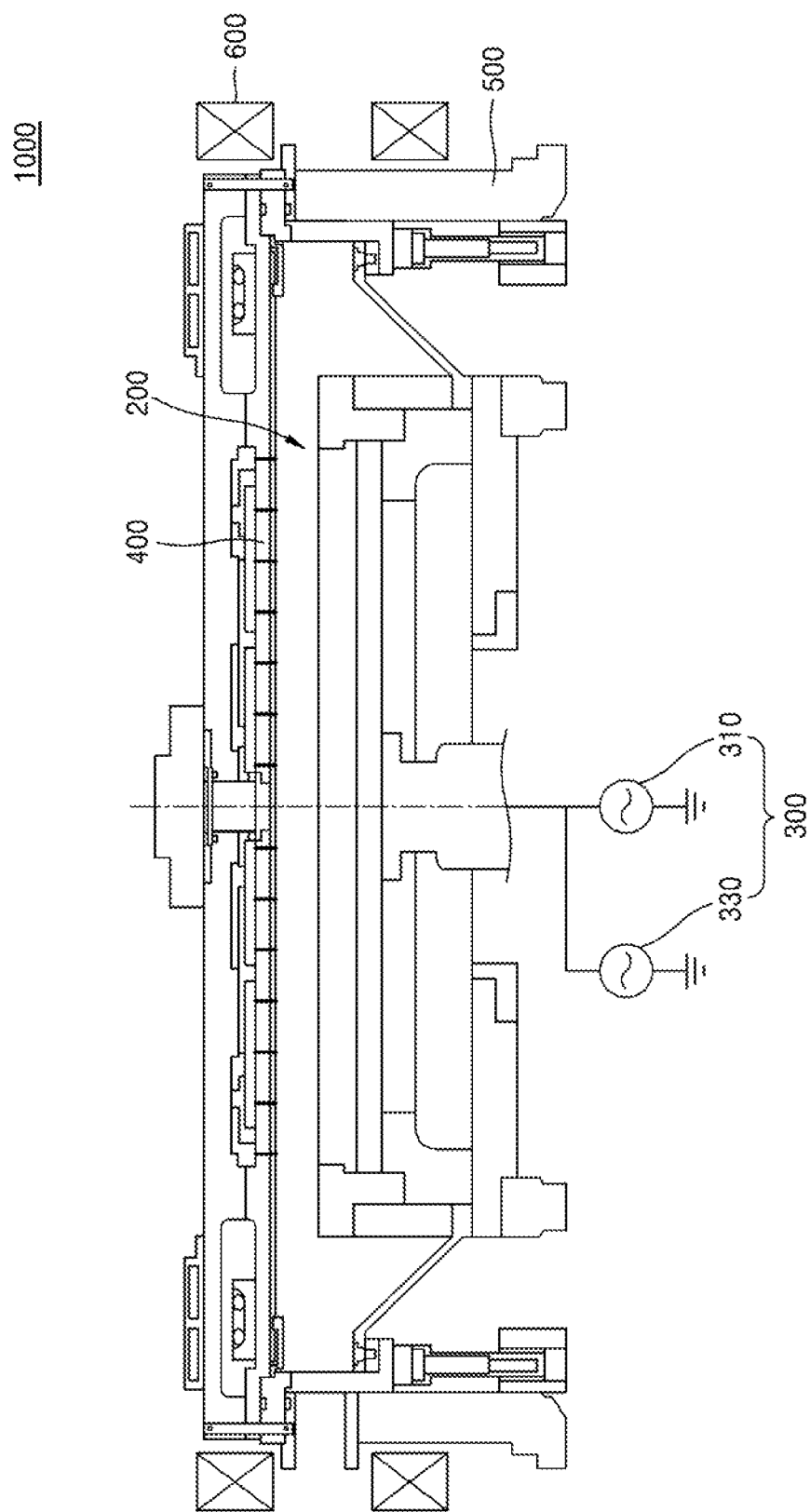
FIG. 12 illustrates a cross-sectional view illustrating a CCP chamber which is used in a patterning method using a metal mask, according to an example embodiment.

FIG. 12 is a cross-sectional view of a capacitively coupled plasma (CCP) chamber 1000 used in a patterning method using a metal mask, according to an example embodiment. For convenience of explanation, descriptions will be made by referring to FIGS. 2A through 2E.

Referring to FIG. 12, in the patterning method according to the present example embodiment, an etching process on the upper metal layer 140 and the lower metal layer 130 may be performed in the CCP chamber 1000.

For reference, a chamber used in the etching process may be mainly divided into a CCP chamber and an inductive coupled plasma (ICP) chamber. The CCP chamber may have a structure in which a lower electrode and an upper electrode are arranged in a chamber as flat plates at an upper portion and a lower portion of the CCP chamber. In a general CCP chamber, an electrostatic chuck may form a lower electrode and a shower head may form an upper electrode, and a source power and a bias power may be connected to the lower electrode. The ICP chamber may have a structure including a coil having a shape in which an upper electrode wraps the chamber, and RF power may be applied to the upper electrode. A lower electrode of the ICP chamber may be formed of an electrostatic chuck of a flat plate, similarly with the CCP chamber, and both of the source power and the bias power may be connected to the lower electrode or only the bias power may be connected to the lower electrode.

In general, in the case of the CCP chamber, plasma in the CCP chamber has a low density and the types of ions that form the plasma may be less. However, the ion energy is very high. Here, that the ion energy is high may denote that the kinetic energy of ions is high due to acceleration between the two electrodes. Accordingly, the CCP chamber may be used mainly to etch a thick dielectric layer.

On the contrary, the ICP chamber has a characteristic opposite to that of the CCP chamber. That is, the plasma in the ICP chamber may have a high density and there may be large types of ions forming the plasma. However, ion energy is low. Accordingly, the ICP chamber may be used mainly to etch a thin metal layer.

In the patterning method according to the present example embodiment, a mask is formed by etching the upper metal layer 140 and the lower metal layer 130. Accordingly, a thick metal layer is to be etched and also an etching process having a relatively high aspect ratio is to be performed. In particular, in the case of the lower metal layer 130, a thickness of about thousands of Å is to be etched, and thus, it may be very difficult to etch the lower metal layer 130 using the ICP chamber.

However, in the patterning method according to the present example embodiment, the CCP chamber 1000 having high ion energy may be used to etch the upper metal layer 140 and the lower metal layer 130, as illustrated in FIG. 12. The CCP chamber 1000 used in the patterning method according to the present example embodiment may have the following differences compared with a comparative CCP chamber. That is, to address the low plasma density and less types of ions forming the plasma in the comparative CCP chamber, the CCP chamber 1000 may apply high-frequency power having a frequency which is equal to or higher than 100 MHz as the source power 330, and magnets 600 may be additionally arranged to strengthen the plasma in the chamber. For reference, in the case of the comparative CCP chamber, the maximum frequency of the source power 330 may be 60 MHz, and hardly any magnets may be arranged.

In the patterning method according to the present example embodiment, the CCP chamber 1000 applying the high frequency source power 330 with the plurality of magnets arranged around the chamber is used, and thus, the upper metal layer 140 and the lower metal layer 130 may be easily etched. Here, reference numeral 400 indicates a shower head by which etchants are diffused and which functions as an upper electrode, and reference numeral 500 indicates a chamber outer wall which separates the inner portion of the chamber from the outside.

Figure 13:
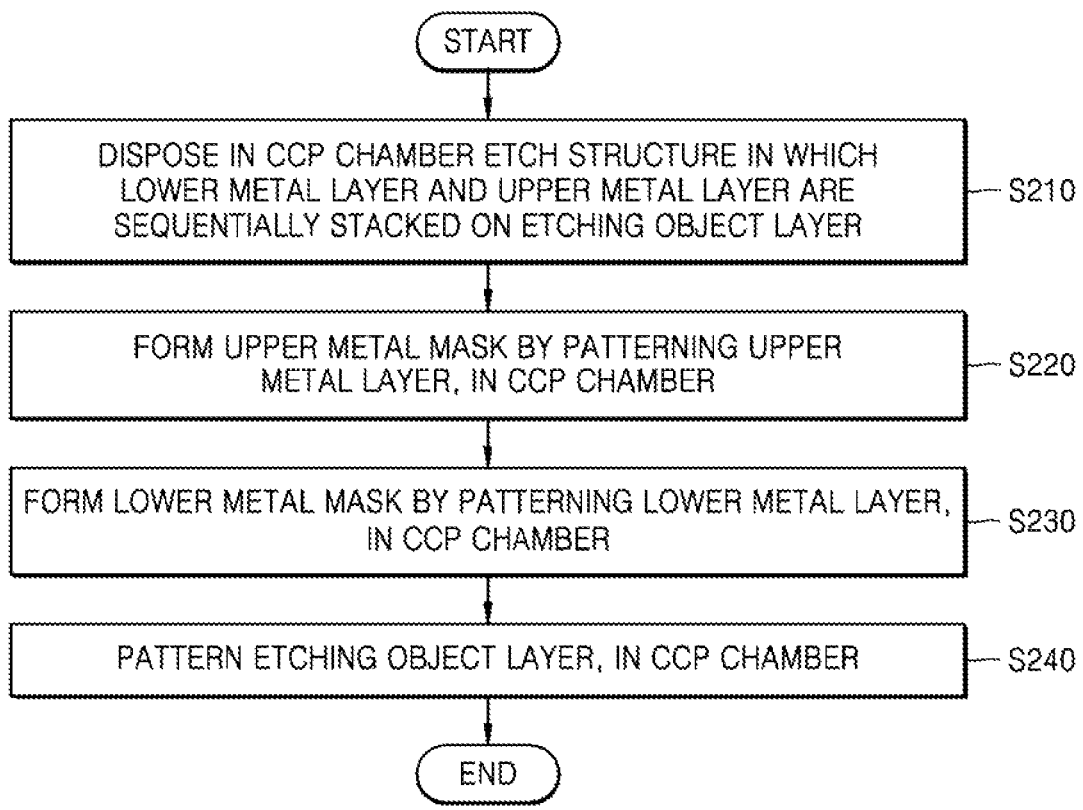
FIG. 13 illustrates a flowchart of a patterning method using a metal mask in a CCP chamber, according to an example embodiment.

FIG. 13 is a flowchart of a patterning method using a metal mask in a CCP chamber, according to an example embodiment. For convenience of explanation, descriptions will be made by referring to FIGS. 2A through 2E and 12. Also, aspects already described with reference to FIGS. 1 through 12 will be briefly described or will not be repeatedly described.

Referring to FIG. 13, first, an etch structure in which the lower metal layer 130 and the upper metal layer 140 are sequentially stacked on the etching object layer 120 is arranged in the CCP chamber 1000 in operation S210. The etch structure may have a structure in which the hardmask 150a is formed on the upper metal layer 140 as illustrated in FIG. 2B. According to cases, the hardmask 150a may also be formed in the CCP chamber 1000.

Next, the upper metal mask 140a is formed in the CCP chamber 1000 by patterning the upper metal layer 140 using the hardmask 150a, in operation S220. To briefly describe an etch process condition with respect to the upper metal layer 140 in the CCP chamber 1000, about 300 W of the source power 330 and about 100 W of the bias power 310 may be applied in a low pressure atmosphere of about 10 atm, by performing a main etch process once. The plasma diffusion is controlled by a magnetic force using the magnets 600, and $Cl_2$, $N_2$, or $NF_3$ may be supplied as an etchant and an atmospheric gas for the etching. In addition, an appropriate process period and a temperature condition may be applied according to a thickness of the upper metal layer 140.

After the upper metal mask 140a is formed, the lower metal mask 130a is formed in the CCP chamber 1000 by patterning the lower metal layer 130 using the upper metal mask 140a in operation S230. In the CCP chamber 1000, the etching process condition with respect to the lower metal layer 130 may be briefly described as follows:

The etching process with respect to the lower metal layer 130 may be mainly divided into a BT process, a first main process, and a deposition/a second main process. The BT process and the first main process are performed one time and the deposition/the second main process may be repeatedly performed by several to dozens times.

BT is an abbreviation of "break through," and the BT process first denotes a process of removing a native oxide layer. The BT process may use Ar or $NF_3$ as an etchant and an atmospheric gas in a low pressure atmosphere of about 10 atm.

The first main process is first a process of etching the lower metal layer 130 (refer to FIG. 5A), and may use $CF_4$ or $O_2$ as an etchant and an atmospheric gas in a low pressure atmosphere of about 10 atm. Here, the source power 330 of about 400 W and the bias power 310 of about 220 W may be applied.

The deposition/the second main process is performed with the first deposition, the second deposition, and the second main process as one cycle, and may be performed by several to dozens times according to a thickness of the lower metal layer 130.

The first and second deposition processes may use $O_2$, Ar, or $SiCl_4$ as a process gas in a low pressure atmosphere of about 10 atm. Here, the source power 330 of about 500 W and the bias power 310 of about 400 W may be applied.

The second main process may use $CF_4$ or $O_2$ as an etchant and an atmospheric gas in a low pressure atmosphere of about 10 atm, similarly with the first main process. Here, the source power 330 of about 400 W and the bias power 310 of about 3150 W may be applied.

After the lower metal mask 130a is formed, the etching object layer pattern 120a is formed by patterning the etching object layer 120 using the lower metal mask 130a, in operation S240. In the CCP chamber, the process of etching the etching object layer 120 formed of a dielectric material, such as an oxide layer or a nitride layer, is well-known, and thus, its detailed description will be omitted By way of summation and review, a degree of integration of the semiconductor devices has been continuously increased. To at least maintain, or improve the device performance, while increasing the degree of integration, a height (thickness) of the semiconductor devices has been increased. Thus, a process of fabricating the semiconductor devices may involve forming holes having high aspect ratios. For example, in the case of a semiconductor memory device, holes having high aspect ratios may be formed mainly in a process of manufacturing a metal contact for connection of wirings, a capacitor for storing data, or a vertical NAND (VNAND) channel.

As described above, embodiments may provide a patterning method which may easily form a hole having a high aspect ratio and a method of fabricating a semiconductor device including the patterning method.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A patterning method using a metal mask, the method comprising:
   sequentially forming a lower metal layer, an upper metal layer, and a hard mask on an etching object layer;
   forming an upper metal mask, forming the upper metal mask including patterning the upper metal layer using the hard mask;
   forming a lower metal mask, forming the lower metal mask including patterning the lower metal layer using the upper metal mask; and
   patterning the etching object layer using the lower metal mask,
   wherein the forming of the lower metal mask includes:
   a first step of etching the lower metal layer using the upper metal mask;
   a second step of forming a passivation layer on the upper metal mask and the lower metal layer; and
   a third step etching the lower metal layer using the upper metal mask and the passivation layer.

2. The method as claimed in claim 1, wherein:
   with respect to a first etchant, the upper metal layer has a higher etch rate than the lower metal layer, and
   with respect to a second etchant, the lower metal layer has a higher etch rate than the upper metal layer.

3. The method as claimed in claim 2, wherein:
   the etching object layer is formed of at least one selected from an oxide material, a nitride material, an oxynitride material, and silicon,
   the lower metal layer includes tungsten (W),
   the upper metal layer includes titanium (Ti),
   the first etchant includes chlorine (Cl), and
   the second etchant includes fluorine (F).

4. The method as claimed in claim 1, wherein:
   the second step and the third step are repeated until the etching object layer is exposed, and
   the second step is performed before a side wall of the lower metal layer is exposed in the third step.

5. The method as claimed in claim 1, wherein:
   an etch stop layer is formed on the etching object layer, and
   the etch stop layer is formed of a material having an etching selectivity with respect to the lower metal layer.

6. The method as claimed in claim 1, wherein the sequentially forming of the lower metal layer and the upper metal layer includes forming a buffer layer on the lower metal layer and forming the upper metal layer on the buffer layer.

7. A patterning method using a metal mask, the method comprising:
   disposing an etch structure, in which a lower metal layer and an upper metal layer are sequentially stacked, on an etching object layer in a capacitively coupled plasma (CCP) chamber;
   forming an upper metal mask, forming the upper metal mask including patterning the upper metal layer in the CCP chamber;
   forming a lower metal mask, forming a lower metal mask including patterning the lower metal layer using the upper metal mask in the CCP chamber; and
   patterning the etching object layer using the lower metal mask in the CCP chamber, wherein:
   the etch structure includes a hard mask formed on the upper metal layer, and the forming of the upper metal mask includes patterning the upper metal mask using the hard mask,
   the CCP chamber includes a source power and a bias power which are electrically connected to an electrostatic chuck, and at least one magnet disposed outside the CCP chamber, and
   the source power is a high frequency power having a frequency that is equal to or higher than 100 MHz.

8. The method as claimed in claim 7, wherein:
   the upper metal layer includes titanium (Ti),
   the lower metal layer includes tungsten (W),
   the forming of the upper metal mask includes etching the upper metal layer using a first etchant including chlorine (Cl), and
   the forming of the lower metal mask includes etching the lower metal layer using a second etchant including fluorine (F).

9. The method as claimed in claim 7, wherein the forming of the lower metal mask includes etching an upper portion of the lower metal layer using the upper metal mask, and repeatedly forming a passivation layer and etching the lower metal layer.

10. The method as claimed in claim 7, wherein:
    an etch stop layer formed of a material having an etching selectivity with respect to the lower metal layer is disposed on the etching object layer, and
    the patterning of the lower metal layer includes exposing the etch stop layer and exposing the etching object layer by etching the etch stop layer before the patterning of the etching object layer.

11. A method of fabricating a semiconductor device, the method comprising:
    forming a through-hole in an etching object layer, forming the through-hole being performed using a patterning using a metal mask, the patterning method including:
    sequentially forming a lower metal layer, an upper metal layer, and a hard mask on the etching object layer;
    forming an upper metal mask, forming the upper metal mask including patterning the upper metal layer using the hard mask;
    forming a lower metal mask, forming the lower metal mask including patterning the lower metal layer using the lower metal mask; and
    patterning the etching object layer using the lower metal mask; and
    filling the through-hole with at least one selected from a semiconductor, a conductor, and a dielectric material.

* * * * *